US010553522B1

(12) United States Patent
Canaperi et al.

(10) Patent No.: US 10,553,522 B1
(45) Date of Patent: *Feb. 4, 2020

(54) SEMICONDUCTOR MICROCOOLER

(71) Applicant: International Business Machines Corporation, Armonk, NY (US)

(72) Inventors: Donald F. Canaperi, Bridgewater, CT (US); Daniel A. Corliss, Waterford, NY (US); Dario Goldfarb, Dobbs Ferry, NY (US); Dinesh Gupta, Hopewell Junction, NY (US); Fee Li Lie, Albany, NY (US); Kamal K. Sikka, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,252

(22) Filed: Aug. 13, 2018

(51) Int. Cl.
| H01L 23/473 | (2006.01) |
| H01L 23/427 | (2006.01) |
| F28F 3/12 | (2006.01) |
| H01L 23/373 | (2006.01) |
| F28F 3/04 | (2006.01) |

(52) U.S. Cl.
CPC ............ *H01L 23/473* (2013.01); *F28F 3/048* (2013.01); *F28F 3/12* (2013.01); *H01L 23/373* (2013.01); *H01L 23/427* (2013.01); *F28F 2260/02* (2013.01)

(58) Field of Classification Search
CPC ............ H01L 23/3672; H01L 23/473; H01L 21/4803; H01L 23/3738; H01L 23/3736
USPC ........................................................ 257/713
See application file for complete search history.

(56) References Cited

U.S. PATENT DOCUMENTS

| 5,548,605 | A | 8/1996 | Benett et al. |
| 5,727,618 | A | 3/1998 | Mundinger et al. |
| 7,115,987 | B2 | 10/2006 | Holakere et al. |
| 7,188,662 | B2 | 3/2007 | Brewer et al. |
| 7,204,298 | B2 | 4/2007 | Hodes et al. |
| 2006/0108097 | A1* | 5/2006 | Hodes ..................... F28F 3/048 165/80.4 |

(Continued)

OTHER PUBLICATIONS

B. L. Lau et al., "Fabrication of package level silicon micro-cooler for electronics cooling," 17th Electronics Packaging and Technology Conference (EPTC), 2015.

(Continued)

*Primary Examiner* — Karen Kusumakar
*Assistant Examiner* — Adam S Bowen
(74) *Attorney, Agent, or Firm* — ZIP Group PLLC

(57) ABSTRACT

A semiconductor microcooler is fabricated by forming fins in a semiconductor substrate and forming a metal layer upon the fins. A stacked microcooler may be formed by stacking a plurality of semiconductor microcoolers. The microcoolers may be positioned such that the fins of each microcooler are aligned. One or more microcoolers may be thermally connected to a surface of a coolant conduit that is thermally connected to an electronic device heat generating device, such as an integrated circuit (IC) chip, or the like. Heat from the electronic device heat generating device may transfer to the one or more microcoolers. A flow of cooled liquid may be introduced through the conduit and heat from the one or more microcoolers may transfer to the liquid coolant.

6 Claims, 17 Drawing Sheets

(56) References Cited

U.S. PATENT DOCUMENTS

2007/0126116 A1    6/2007  Dangelo et al.
2008/0196875 A1    8/2008  Kurtz et al.
2017/0186728 A1*   6/2017  Chainer .............. H01L 25/0657

OTHER PUBLICATIONS

Evan G. Colgan et al., "A practical implementation of silicon microchannel coolers for high power chips," IEEE Transactions on Components and Packaging Technologies, vol. 30, No. 2, 2007, pp. 218-225.

Idris Al Siyabi et al., "Thermal analysis of a multi-layer microchannel heat sink for cooling concentrator photovoltaic (CPV) cells," AIP Conference Proceedings, vol. 1881, No. 1, 2017.

List of IBM Patents or Patent Applications Treated As Related, dated herewith.

* cited by examiner

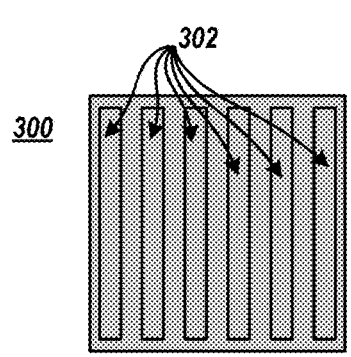 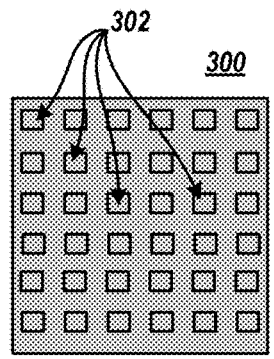 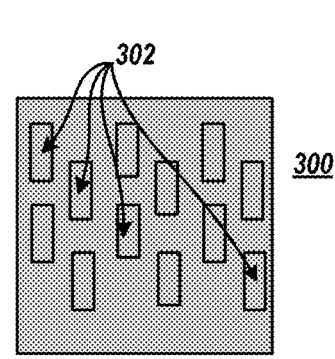
FIG. 4A  FIG. 4B  FIG. 4C
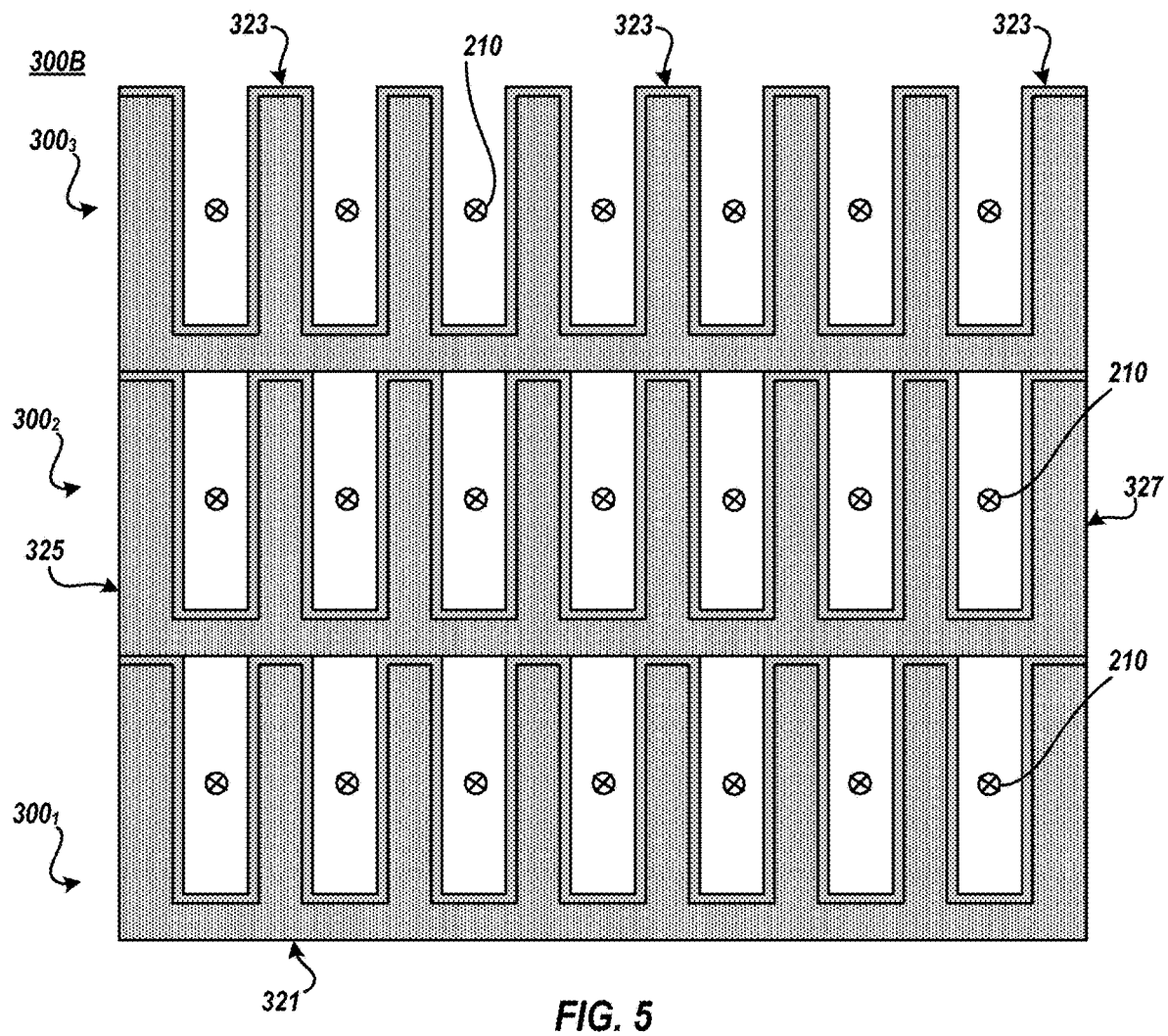
FIG. 5

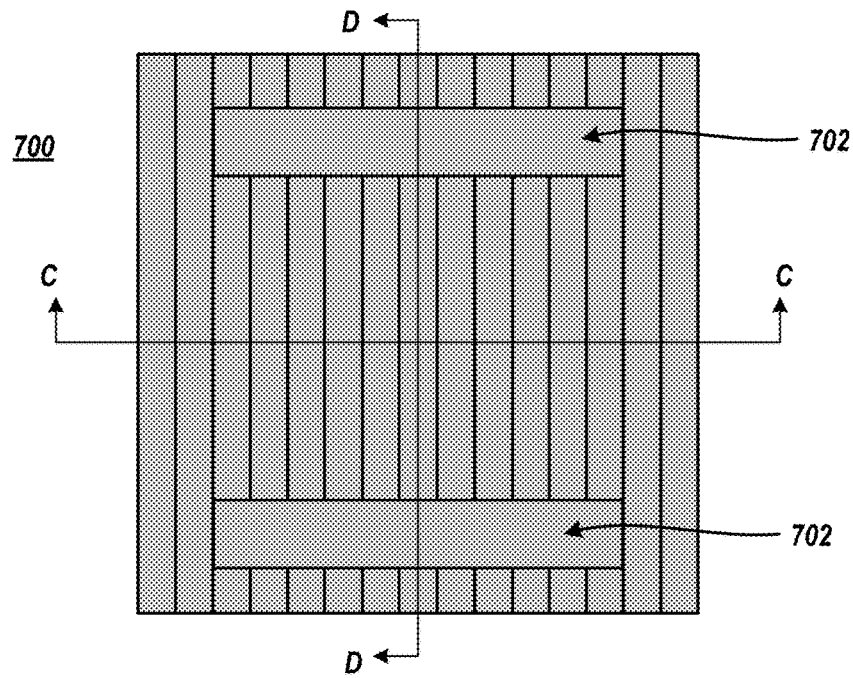
FIG. 22
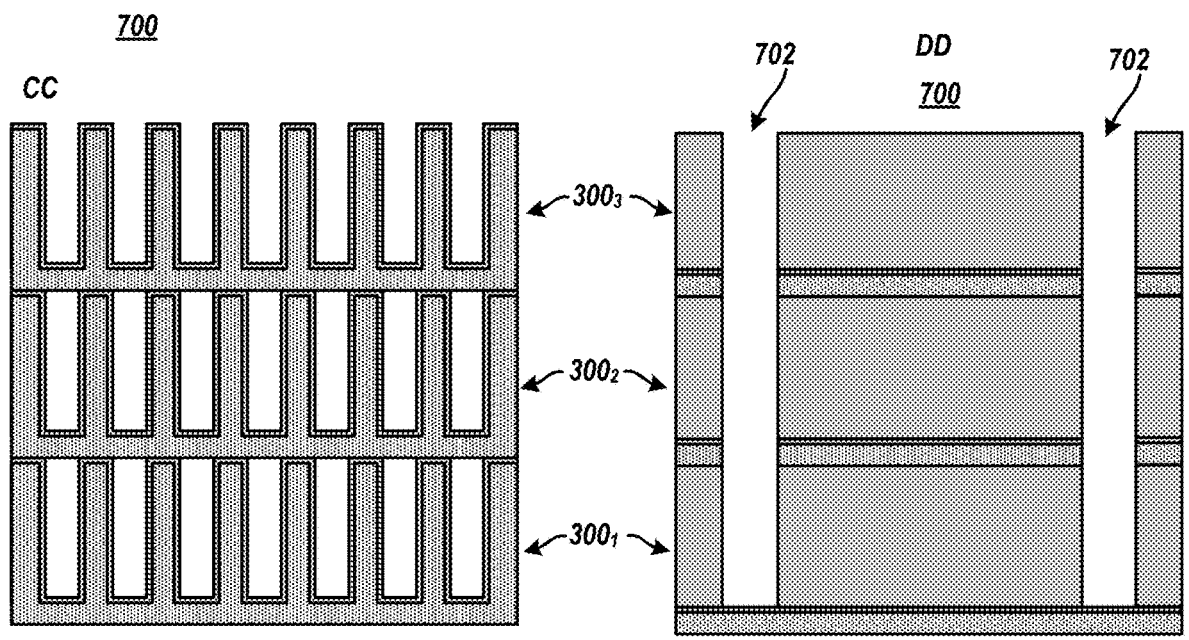
FIG. 23  FIG. 24

SEMICONDUCTOR MICROCOOLER

FIELD OF THE EMBODIMENTS

Embodiments of the present invention generally relate to cooling electronic devices, such as integrated circuit (IC) chips, processors, or the like, with a liquid cooling system that utilizes one or more semiconductor microcoolers.

DESCRIPTION OF THE RELATED ART

Though the size constraints of electronic devices are generally decreasing, the computing power of those devices are generally increasing. As such, electronic systems will generally require high power consumption devices which requires the removal of an increased amount of heat. Another approach may be to package more computing devices in a smaller area which would also require the removal of an increased amount of heat.

SUMMARY

In an embodiment of the present invention, a method is presented. The method includes forming a first semiconductor microcooler by removing portions of a first bulk silicon substrate to form a plurality of first silicon fins and a plurality of first fin trenches, forming a first copper layer upon sidewalls of each of the plurality of first silicon fins, and by forming a first bonding layer upon a respective upper surface of each of the first plurality of silicon fins. Each first fin trench separates adjacent first silicon fins. The method further includes forming a second semiconductor microcooler by removing portions of a second bulk silicon substrate to form a plurality of second silicon fins and a plurality of second fin trenches, forming a second copper layer upon sidewalls of each of the plurality of second silicon fins, and by forming a second bonding layer upon a respective upper surface of each of the second plurality of silicon fins. Each second fin trench separates adjacent second silicon fins. The method further includes stacking the first microcooler and the second microcooler by vertically aligning the plurality of first fin trenches with the plurality of second fin trenches and thermally connecting the first bonding layer and the second bonding layer.

In another embodiment of the present invention, a heat transfer method is presented. The method includes causing a flow of liquid coolant through a plurality of fin trenches of a stacked semiconductor microcooler. The stacked semiconductor microcooler includes a first semiconductor microcooler comprising a plurality of first silicon fins and a plurality of first fin trenches, a first copper layer upon sidewalls of each of the plurality of first silicon fins, and a first bonding layer upon a respective upper surface of each of the first plurality of silicon fins. Each first fin trench separates adjacent first silicon fins. The stacked semiconductor microcooler also includes a second semiconductor microcooler comprising a plurality of second silicon fins and a plurality of second fin trenches, a second copper layer upon sidewalls of each of the plurality of second silicon fins, and a second bonding layer upon a respective upper surface of each of the second plurality of silicon fins. Each second fin trench separates adjacent second silicon fins.

In yet another embodiment of the present invention, an electronic system is presented. The electronic system includes an integrated circuit (IC) chip thermally connected to a conduit configured to contain liquid coolant. The electronic system also includes a stacked semiconductor microcooler thermally connected to an internal surface of the conduit. The stack semiconductor microcooler includes a first semiconductor microcooler comprising a plurality of first silicon fins and a plurality of first fin trenches, a first copper layer upon sidewalls of each of the plurality of first silicon fins, and a first bonding layer upon a respective upper surface of each of the first plurality of silicon fins. Each first fin trench separates adjacent first silicon fins. The stacked semiconductor microcooler also includes a second semiconductor microcooler comprising a plurality of second silicon fins and a plurality of second fin trenches, a second copper layer upon sidewalls of each of the plurality of second silicon fins, and a second bonding layer upon a respective upper surface of each of the second plurality of silicon fins. Each second fin trench separates adjacent second silicon fins.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4A, FIG. 4B, and FIG. 4C depicts a top view of a semiconductor microcooler, according to one or more embodiments of the present invention.

FIG. 5 depicts a cross section view of a stacked semiconductor microcooler, according to one or more embodiments of the present invention.

FIG. 22, FIG. 23, and FIG. 24 depict a stacked semiconductor microcooler, according to one or more embodiments of the present invention.

DETAILED DESCRIPTION

A semiconductor microcooler is fabricated by forming fins in a semiconductor substrate and forming a metal layer upon the fins. A stacked microcooler may be formed by stacking a plurality of semiconductor microcoolers. The stacked semiconductor microcoolers may be positioned such that the fins of the microcoolers are aligned. One or more microcoolers may be thermally connected to a surface of a coolant conduit that is thermally connected to an electronic device heat generating device, such as an integrated circuit (IC) chip, or the like. Heat from the electronic device heat generating device may transfer to the one or more microcoolers. A flow of cooled liquid may be introduced through the conduit and heat from the one or more microcoolers may transfer to the liquid coolant.

Figure 1:
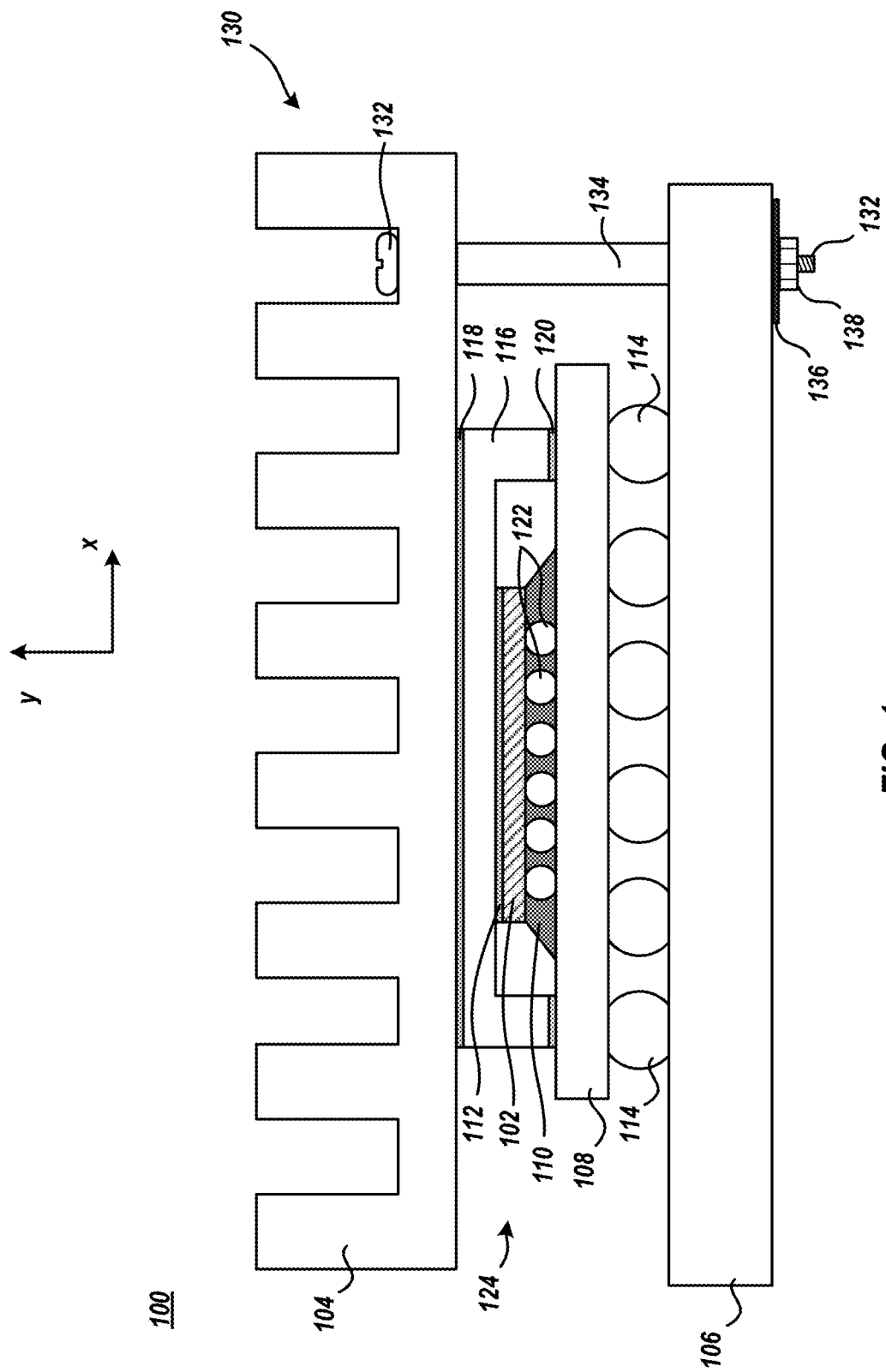
FIG. 1 depicts a prior art electronic system that utilizes a passive cooling system.

FIG. 1 depicts a prior art electronic device 100 utilizing a passively cooled package 124. Electronic device 100 may be for example a computer, server, mobile device, tablet, and the like. Package 124 includes chip 102, carrier 108, interconnects 122, underfill 110, thermal interface material 112, lid 116, and adhesive 120. Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102 a heat sink 104 may be thermally joined to package 124 via thermal interface material 118. Heat sink 104 is a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon package 124.

Figure 2A:
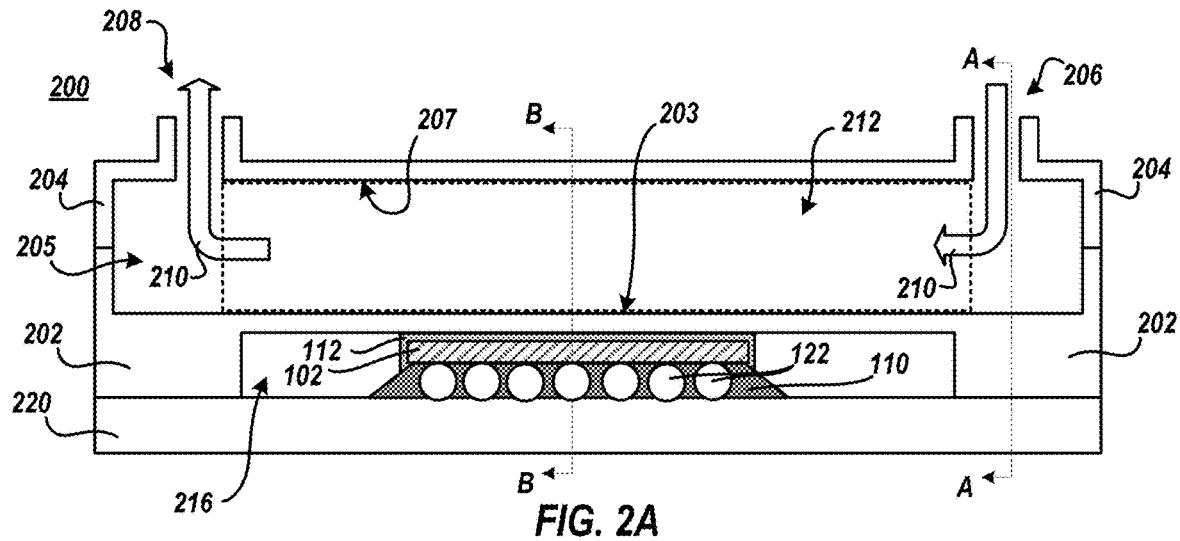
FIG. 2A and FIG. 2B depicts an IC chip package that is cooled by a liquid cooling system that utilizes one or more embodiments of the present invention.
Figure 2B:
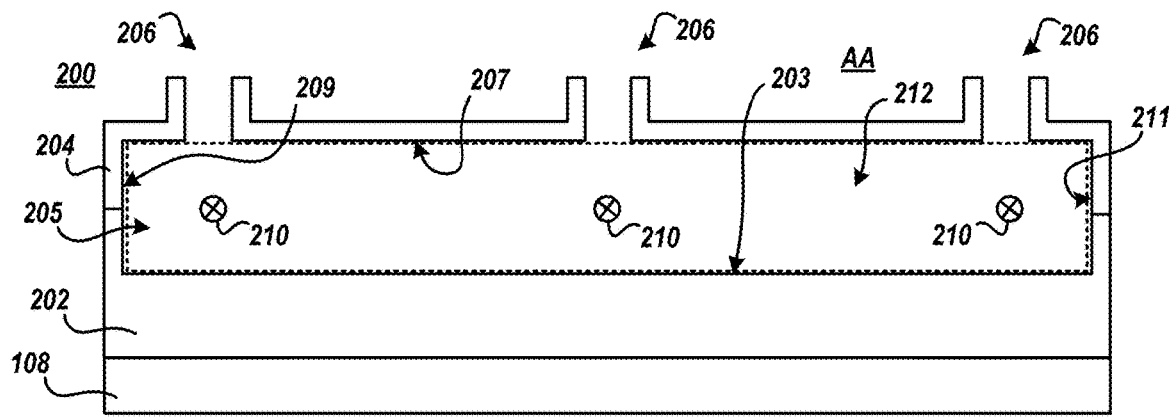

FIG. 2A and FIG. 2B depicts an IC chip package 200 that is cooled by a liquid cooling system. FIG. 2B is a cross section view of package 200 at the AA plane as indicated in FIG. 2A. Package 200 includes IC chip 102, carrier 108, interconnects 122, underfill 110, thermal interface material 112, a first housing 202, and second housing 204. First housing 202, which may be referred herein as lower housing, may contact carrier 108 and is thermally connected to IC chip 102 by way of thermal interface material 112 which reduces air gaps between the IC chip 102 and the lower housing 202. The term "thermally connected," is herein defined to be an indirect or direct connection between elements such that heat from one element transfers to the other element by thermal conduction more efficiently than if air separates the elements. Lower housing 202 may include an underside cavity 216 to allow for the IC chip 102 to thermally connect with an IC chip facing surface of the cavity 216 while a carrier facing surface of the housing 202 may simultaneously thermally connect with carrier 108.

The second housing 202 may be sealed against, and is thermally connected to, the first housing such that an air tight internal void or cavity 205 is formed therebetween. The second housing 204 may include one or more liquid coolant inlets 206 and one or more liquid coolant outlets 108. A heat exchanger may cool the liquid coolant prior to being introduced into the cavity 205. A flow 210 of liquid coolant may be induced by a pump, or the like, from the heat exchanger to the one or more liquid coolant inlets 206 through the cavity 205 and exiting the cavity 205 by way of the one or more liquid coolant outlets 108 whereby the liquid coolant returns to the heat exchanger. As IC chip 102 generates heat, that heat is transferred into the housing 202 and into the liquid coolant flowing through cavity 205. The heat exchanger, in turn, cools the liquid coolant prior to the liquid coolant being reintroduced into cavity 205. As such, cooled liquid coolant enters cavity 205 by the one or more inlets 206 and heated liquid coolant exits cavity 205 by the one or more outlets 108.

Cavity 205 may include a coolant flow 210 conduit region 212 that defines the coolant flow 210 in the general direction between the inlet(s) 206 and the outlet(s) 108. The region 212 is bounded by a front plane(s) just downstream of the inlet(s) 206, by a rear plant just upstream of the outlet(s) 108, by an upper surface 207 of cavity 205, by a lower surface 203 of cavity 203, by a first side surface 209 of cavity 205, and by a second side surface 211 of cavity 205.

Figure 3:
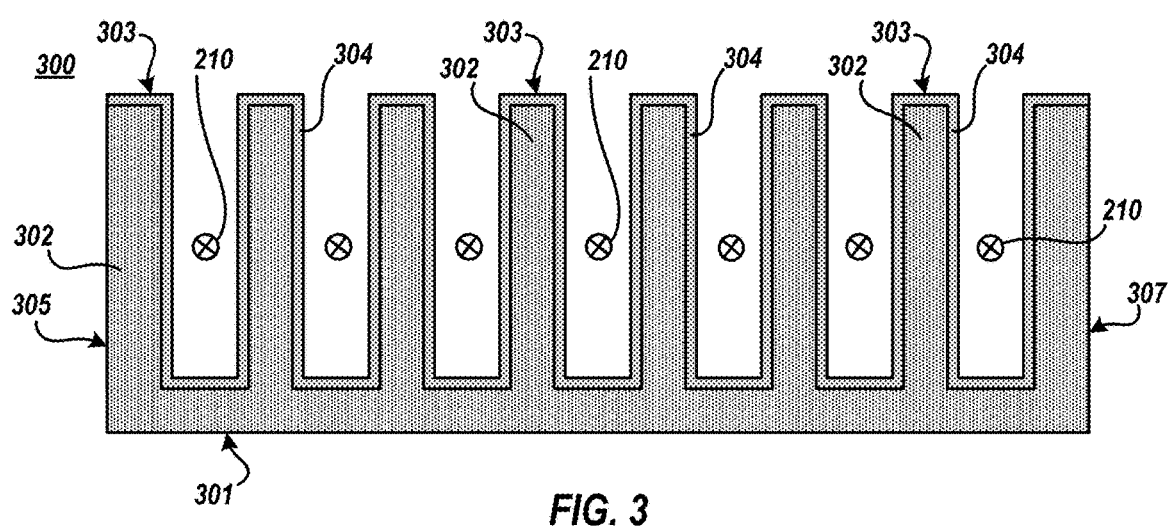
FIG. 3 depicts a cross section view of a semiconductor microcooler, according to one or more embodiments of the present invention.

FIG. 3 depicts a cross section view of a semiconductor microcooler 300, according to one or more embodiments of the present invention. Semiconductor microcooler 300 includes a plurality of semiconductor fins 302 separated from neighboring fin(s) by respective fin trenches. The fins 302 have a metal layer 304 thereupon. For example, the metal layer 304 is formed on the upper surface of the fins, the front surface of the fins, the rear surface of the fins, a first side surface of the fins, and an opposing second side surface of the fins. The metal layer 304 may also be formed upon the lower surface of each fin trench. The first side surface of the fins 302 and the opposing second side surface of the fins 302 may be parallel or may be angled relative thereto. For example, the shape of fins 302 may be generally rectangular or may be triangular. Further fin 302 cross section shapes that are contemplated are diamond, trapezoid, or the like. Semiconductor microcooler 300 may include a lower surface 301, and upper surface 303, a first side surface 305, and a second side surface 307. In an embodiment, semiconductor fins 302 are silicon fins and metal layer 304 is a copper layer.

The fins 302 may have a height of 0.5-5 mm and may have a width of 25-1000 um.

One or more semiconductor microcooler(s) 300 may be thermally connected to one or more surfaces of first housing 202 and/or the second housing 204 that defines conduit region 212, to increase the surface area thereof. As such, heat from the one or more surfaces of first housing 202 and/or the second housing 204 is transferred into the fins 302 and into the metal layer 304. The semiconductor microcooler(s) 300 may be positioned such that the fins 302 are generally parallel to the direction of the liquid coolant flow 210. Generally, when semiconductor microcooler(s) 300 are thermally connected to the one or more surfaces of first housing 202 and/or the second housing 204, the liquid coolant flows within the fin trenches. In this way, with the addition of the one or more semiconductor microcooler(s) 300 within the conduit region 212, heat is transferred relatively more efficiently from the first housing 202 and/or the second housing 204 into the liquid coolant flow 210.

FIG. 4A, FIG. 4B, and FIG. 4C depicts exemplary top views of semiconductor microcooler 300, according to one or more embodiments of the present invention. As depicted in FIG. 4A, fins 302 may be have a rectangular top view shape and may extend from a front of the semiconductor substrate to the rear of the semiconductor substrate. As depicted in FIG. 4B, fins 302 may be arranged in an array of row and columns of rectangular top view shaped fins, square top view shaped fins, or the like. As depicted in FIG. 4C, fins 302 may be arranged in a staggered array of rectangular top view shaped fins, square top view shaped fins, or the like.

FIG. 5 depicts a cross section view of a stacked semiconductor microcooler 300B, according to one or more embodiments of the present invention. Stacked semiconductor microcooler 300B includes a plurality of stacked semiconductor microcooler 300. For example, stacked semiconductor microcooler 300B includes a semiconductor microcooler $300_1$, semiconductor microcooler $300_2$, and semiconductor microcooler $300_3$. Semiconductor microcooler $300_2$ is stacked upon semiconductor microcooler $300_1$. Semiconductor microcooler $300_3$ is stacked upon semiconductor microcooler $300_2$. For clarity, though three semiconductor microcoolers 300 are shown stacked, a stacked semiconductor microcooler may include two or more semiconductor microcoolers 300 stacked relative each other.

The plurality of stacked semiconductor microcooler 300 may have the same orientation, as is depicted, whereby each lower surface 301 of each semiconductor microcooler 300 is facing the same direction. In such implementation, the top surface 303 of a semiconductor microcooler 300 may be bonded and thermally connected to the lower surface 301 of another semiconductor microcooler 300. The semiconductor microcooler 300s may be stacked such that the fins 302 and fin trenches of the semiconductor microcoolers 300 are aligned. First side surface 325 may be formed by coplanar first side surfaces 305 of each semiconductor microcooler 300. Likewise, second side surface 327 may be formed by coplanar second side surfaces 307 of each semiconductor microcooler 300.

Alternatively, the plurality of stacked semiconductor microcooler 300 may have differing orientation whereby lower surfaces 301 of two or more semiconductor microcooler 300 may face towards each other or away from each other. In such implementation, the top surface 303 of a semiconductor microcooler 300 may be bonded and thermally connected to the top surface 303 of another semiconductor microcooler 300. The fins 302 and fin trenches of these semiconductor microcoolers 300 may be aligned, thereby increasing (e.g. doubling, etc.) the size of the fin trenches that separate the fins 302. First side surface 325 may be formed by a coplanar first side surface 305 of a first microcooler 300 and a second side surface 307 of a second microcooler 300. Likewise, second side surface 327 may be formed by a coplanar second side surface 307 of the first microcooler and the first side surface 307 of the second microcooler 300.

Stacked semiconductor microcooler 300B may include a lower surface 321, an upper surface 323, a first side surface 325, and a second side surface 325. Such surfaces 321, 323, 325, and/or 325 may be thermally connected to one or more surfaces of first housing 202 and/or the second housing 204 that defines conduit region 212, to increase the surface area thereof. As such, heat from the one or more surfaces of first housing 202 and/or the second housing 204 is transferred into the fins 302 and into the metal layer 304. The stacked semiconductor microcooler(s) 300B may be positioned such that the fins 302 of each microcooler 300 are generally parallel to the direction of the liquid coolant flow 210. Generally, when stacked semiconductor microcooler(s) 300B are thermally connected to the one or more surfaces of first housing 202 and/or the second housing 204, the liquid coolant flows within the fin trenches. In this way, with the addition of the one or more stacked semiconductor microcooler(s) 300B within the conduit region 212, heat is transferred relatively more efficiently from the first housing 202 and/or the second housing 204 into the liquid coolant flow 210.

Figure 6A:
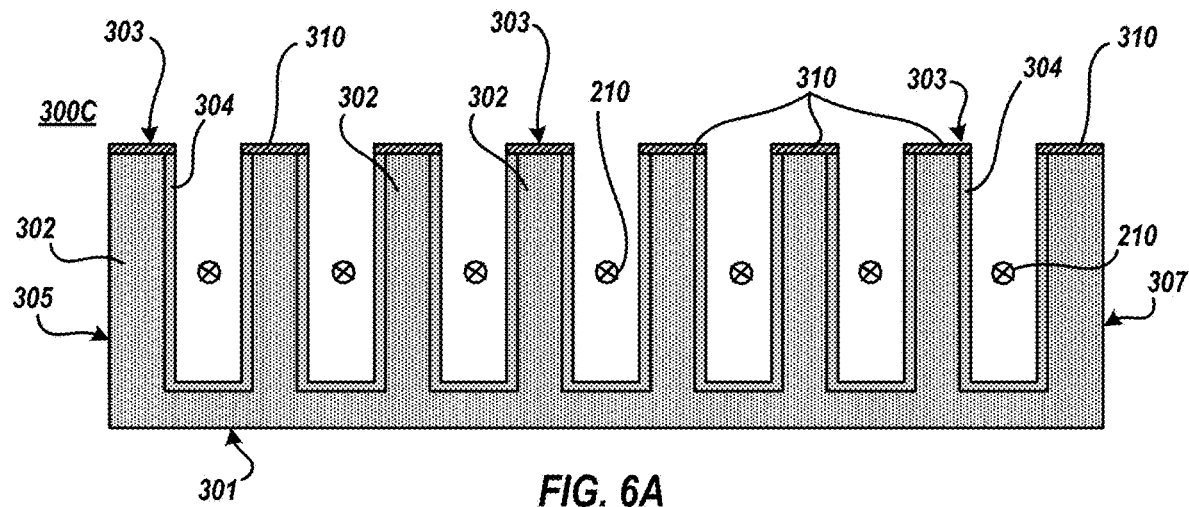
FIG. 6A depicts a cross section view of a semiconductor microcooler, according to one or more embodiments of the present invention.

FIG. 6A depicts a cross section view of a semiconductor microcooler 300C, according to one or more embodiments of the present invention. Semiconductor microcooler 300C includes a plurality of semiconductor fins 302 that are each separated from an immediate neighboring fin by a fin trench. The fins 302 have a bonding layer 310 and a metal layer 304 formed thereupon. For example, the bonding layer 310 is formed on the upper surface of the fins and the metal layer 304 is formed upon the front surface of the fins, the rear surface of the fins, a first side surface of the fins, and an opposing second side surface of the fins. The metal layer 304 may also be formed upon the lower surface of each fin trench. Semiconductor microcooler 300C may include a lower surface 301, and upper surface 303, a first side surface 305, and a second side surface 307. The bonding layer 310 may be a layer of indium, titanium, silicon oxide, or the like.

One or more semiconductor microcooler(s) 300C may be thermally connected to one or more surfaces of first housing 202 and/or the second housing 204 that defines conduit region 212, to increase the surface area thereof. As such, heat from the one or more surfaces of first housing 202 and/or the second housing 204 is transferred into the fins 302 and into the metal layer 304. The semiconductor microcooler(s) 300C may be positioned such that the fins 302 are generally parallel to the direction of the liquid coolant flow 210. Generally, when semiconductor microcooler(s) 300C are thermally connected to the one or more surfaces of first housing 202 and/or the second housing 204, the liquid coolant flows within the fin trenches. In this way, with the addition of the one or more semiconductor microcooler(s) 300 within the conduit region 212, heat is transferred relatively more efficiently from the first housing 202 and/or the second housing 204 into the liquid coolant flow 210.

Figure 6B:
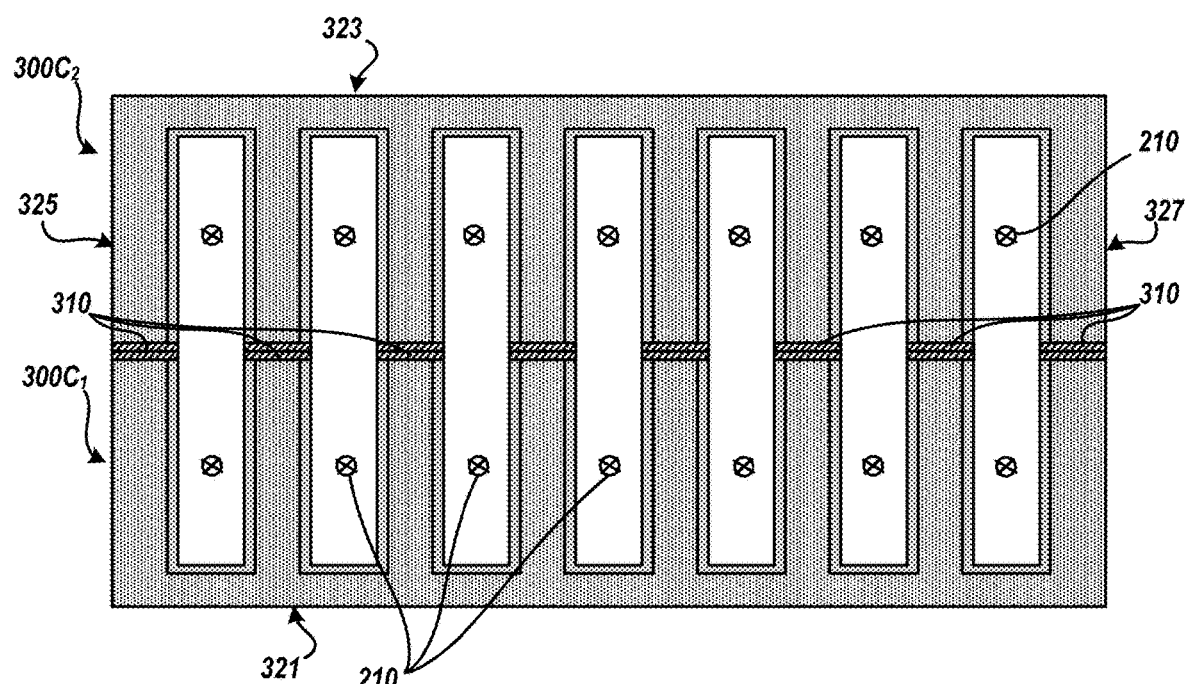
FIG. 6B depicts a cross section view of a stacked semiconductor microcooler, according to one or more embodiments of the present invention.

FIG. 6B depicts a cross section view of a stacked semiconductor microcooler 300D, according to one or more embodiments of the present invention. Stacked semiconductor microcooler 300D includes a plurality of stacked semiconductor microcoolers 300C. For example, stacked semiconductor microcooler 300D includes a semiconductor microcooler $300C_1$ and a semiconductor microcooler $300C_2$. Semiconductor microcooler $300C_2$ is stacked upon semiconductor microcooler $300C_1$. For clarity, though two semiconductor microcoolers 300C are shown stacked, a stacked semiconductor microcooler may include a greater number of semiconductor microcoolers 300 stacked relative to one another.

The plurality of stacked semiconductor microcooler 300C may have the same orientation, whereby each lower surface 301 of each semiconductor microcooler 300C is facing the same direction. In such implementation, the top surface 303 of a semiconductor microcooler 300C may be bonded and thermally connected to the lower surface 301 of another semiconductor microcooler 300C. The semiconductor microcooler 300C may be stacked such that the fins 302 and fin trenches of the semiconductor microcoolers 300C are aligned. First side surface 325 may be formed by coplanar first side surfaces 305 of each semiconductor microcooler 300C. Likewise, second side surface 327 may be formed by coplanar second side surfaces 307 of each semiconductor microcooler 300C.

Alternatively, the stacked semiconductor microcooler 300C may have differing orientation whereby lower surfaces 301 of two or more semiconductor microcooler 300C may face towards each other or away from each other. In such implementation, the top surface 303 of a semiconductor microcooler 300C may be bonded and thermally connected to the top surface 303 of another semiconductor microcooler 300C. The fins 302 and fin trenches of these semiconductor microcoolers 300C may be aligned, thereby increasing (e.g. doubling, etc.) the size of the fin trenches that separate the fins 302, as depicted. First side surface 325 may be formed by a coplanar first side surface 305 of a first microcooler 300C and a second side surface 307 of a second microcooler 300C. Likewise, second side surface 327 may be formed by a coplanar second side surface 307 of the first microcooler 300C and the first side surface 307 of the second microcooler 300C.

Stacked semiconductor microcooler 300D may include a lower surface 321, an upper surface 323, a first side surface 325, and a second side surface 325. Such surfaces 321, 323, 325, and/or 325 may be thermally connected to one or more surfaces of first housing 202 and/or the second housing 204 that defines conduit region 212, to increase the surface area thereof. As such, heat from the one or more surfaces of first housing 202 and/or the second housing 204 is transferred into the fins 302 and into the metal layer 304. The stacked semiconductor microcooler(s) 300D may be positioned such that the fins 302 of each microcooler 300 are generally parallel to the direction of the liquid coolant flow 210. Generally, when stacked semiconductor microcooler(s) 300D are thermally connected to the one or more surfaces of first housing 202 and/or the second housing 204, the liquid coolant flows within the fin trenches. In this way, with the addition of the one or more stacked semiconductor microcooler(s) 300D within the conduit region 212, heat is transferred relatively more efficiently from the first housing 202 and/or the second housing 204 into the liquid coolant flow 210.

Figure 7:
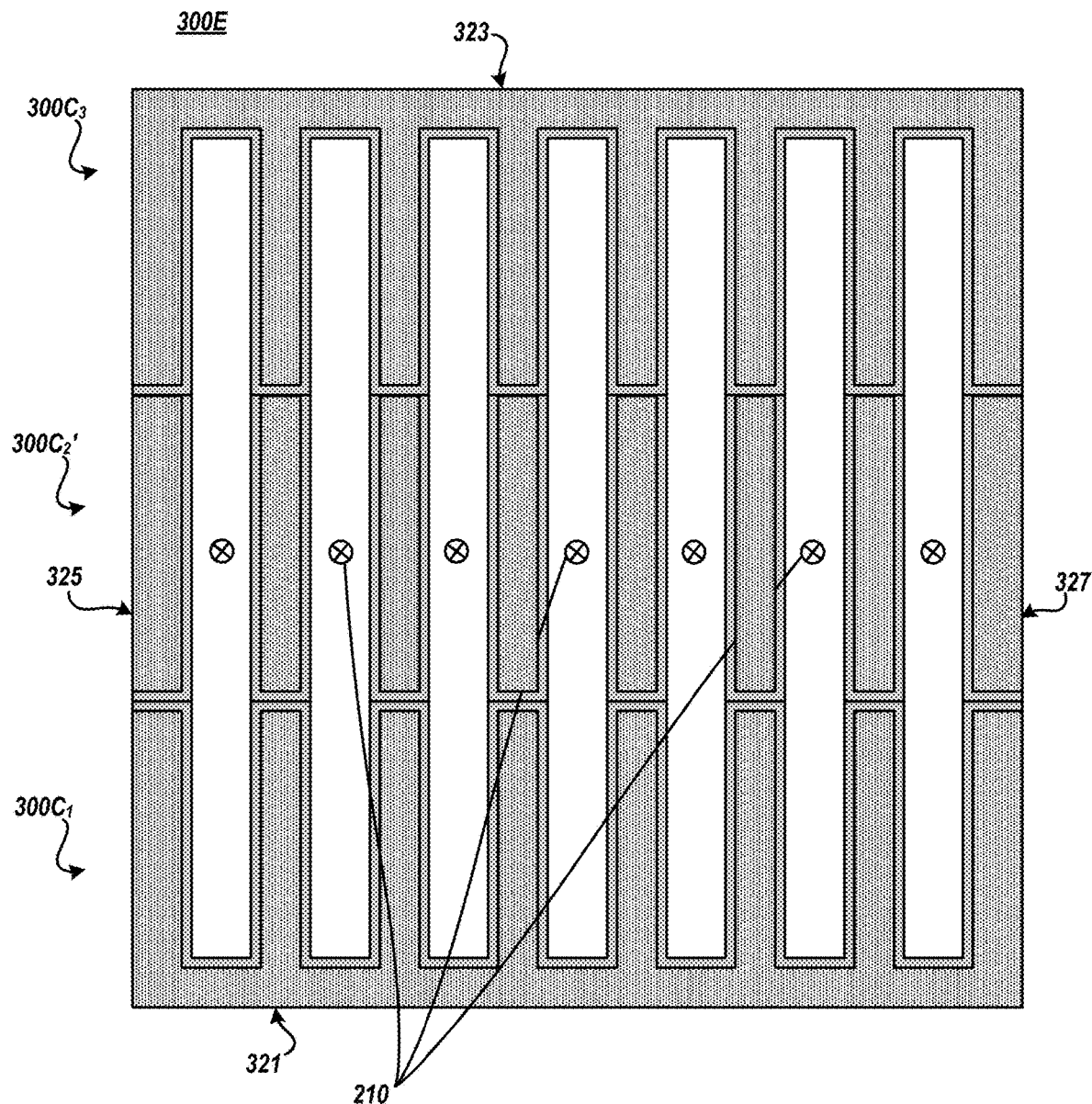
FIG. 7 depicts a cross section view of a stacked semiconductor microcooler, according to one or more embodiments of the present invention.

FIG. 7 depicts a cross section view of a stacked semiconductor microcooler 300E, according to one or more embodiments of the present invention. Stacked semiconductor microcooler 300E includes a plurality of stacked semiconductor microcoolers 300E. For example, stacked semiconductor microcooler 300E includes a semiconductor microcooler $300C_1$, a semiconductor microcooler $300C_2'$ that has had its backside polished, and semiconductor microcooler $300C_3$. Semiconductor microcooler $300C_2'$ is stacked upon semiconductor microcooler $300C_1$, Semiconductor microcooler $300C_3$ is stacked upon semiconductor microcooler $300C_2'$ For clarity, though three semiconductor microcoolers 300C are shown stacked, a stacked semiconductor microcooler may include two or more semiconductor microcoolers 300C stacked relative each other.

The plurality of stacked semiconductor microcooler 300C may have the same orientation, whereby each lower surface 301 of each semiconductor microcooler 300C is facing the same direction. In such implementation, the top surface 303 of a semiconductor microcooler 300C may be bonded and thermally connected to the lower surface 301 of another semiconductor microcooler 300C. The semiconductor microcoolers 300C may be stacked such that the fins 302 and fin trenches of the semiconductor microcoolers 300E are aligned. First side surface 325 may be formed by coplanar first side surfaces 305 of each semiconductor microcooler 300C. Likewise, second side surface 327 may be formed by coplanar second side surfaces 307 of each semiconductor microcooler 300C.

As depicted, the plurality of stacked semiconductor microcooler 300E may have differing orientation whereby lower surfaces 301 of the semiconductor microcoolers 300C may face towards each other and/or away from each other. In such implementation, the top surface 303 of a semiconductor microcooler $300C_1$ may be bonded and thermally connected to the top surface 303 of another semiconductor microcooler $300C_2'$. The backside of semiconductor microcooler $300C_2'$ is polished to remove excess semiconductor material and/or metal layer 304 material such that fins 302 and metal layer 304 thereupon remain. Subsequently, the top surface 303 of semiconductor microcooler $300C_3$ may be bonded and thermally connected to the polished backside surface of semiconductor microcooler $300C_2'$.

The fins 302 and fin trenches of these semiconductor microcoolers 300C may be aligned, thereby increasing (e.g. tripling, as is depicted, etc.) the size of the fin trenches that separate the fins 302. First side surface 325 may be formed by a coplanar first side surface 305 of a first microcooler 300 and a second side surface 307 of a second microcooler 300. Likewise, second side surface 327 may be formed by a coplanar second side surface 307 of the first microcooler and the first side surface 307 of the second microcooler 300E.

Stacked semiconductor microcooler 300E may include a lower surface 321, an upper surface 323, a first side surface 325, and a second side surface 325. Such surfaces 321, 323, 325, and/or 325 may be thermally connected to one or more surfaces of first housing 202 and/or the second housing 204 that defines conduit region 212, to increase the surface area thereof. As such, heat from the one or more surfaces of first housing 202 and/or the second housing 204 is transferred into the fins 302 and into the metal layer 304. The stacked semiconductor microcooler(s) 300E may be positioned such that the fins 302 of each microcooler 300C are generally parallel to the direction of the liquid coolant flow 210. Generally, when stacked semiconductor microcooler(s) 300E are thermally connected to the one or more surfaces of first housing 202 and/or the second housing 204, the liquid coolant flows within the fin trenches. In this way, with the addition of the one or more stacked semiconductor microcooler(s) 300E within the conduit region 212, heat is transferred relatively more efficiently from the first housing 202 and/or the second housing 204 into the liquid coolant flow 210.

Figure 8:
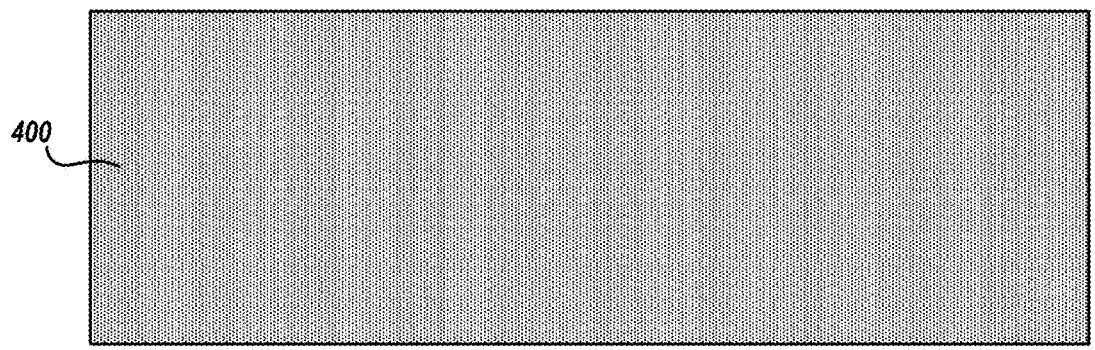
FIG. 8 depicts an initial fabrication stage of a process flow to form a semiconductor microcooler, according to one or more embodiments of the present invention.

FIG. 8 depicts an initial fabrication stage of a process flow to form a semiconductor microcooler, according to one or more embodiments of the present invention. At the initial fabrication stage, a bulk semiconductor substrate 400 is provided.

The semiconductor substrate 400 is a bulk semiconductor material substrate. Semiconductor substrate materials may include undoped Si, n doped Si, p doped Si, single crystal Si, polycrystalline Si, amorphous Si, Ge, SiGe, SiC, SiGeC, Ga, GaAs, InAs, InP and all other III/V or II/VI compound semiconductors. In a preferred embodiment, semiconductor substrate 400 is a Si bulk substrate. Typically, the substrate 400 may be about, but is not limited to 700-800 um. For example, the substrate 400 may have a thickness ranging from 0.5 mm to about 3 mm.

Figure 9:
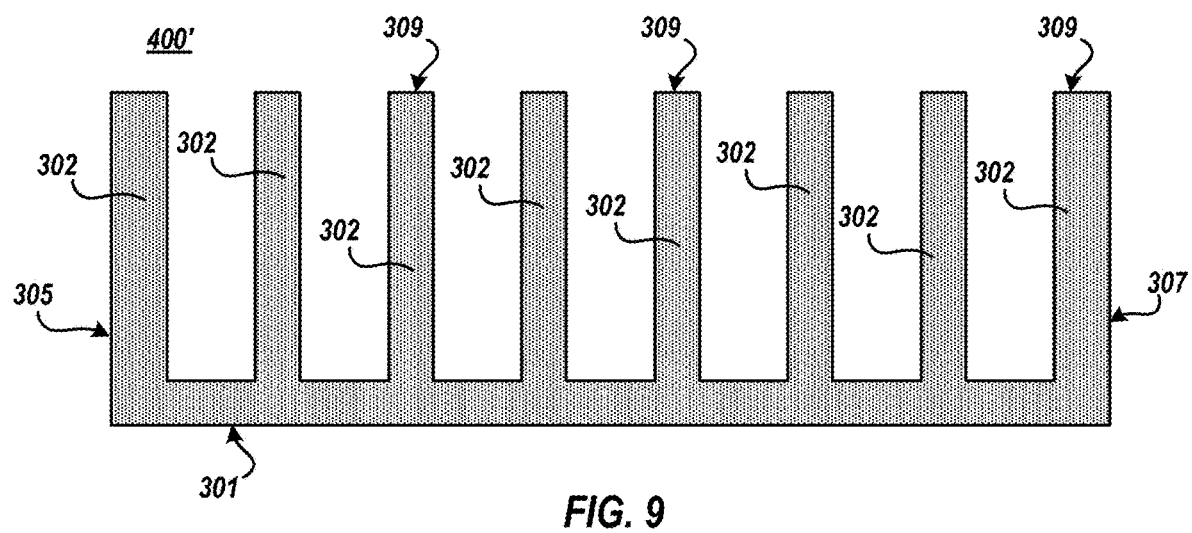
FIG. 9 depicts another fabrication stage of the process flow to form a semiconductor microcooler, according to one or more embodiments of the present invention.

FIG. 9 depicts another fabrication stage of the process flow to form a semiconductor microcooler, according to one or more embodiments of the present invention. At this fabrication stage, a finned semiconductor substrate 400' is formed. Finned semiconductor substrate 400' is formed by fabricating fins 302 within substrate 400. Finned semiconductor substrate 400' may also include a front surface, rear surface, lower surface 301, first side surface 305, and second side surface 307. A fin 302 may include a front surface, rear surface, first sidewall surface 370, second sidewall surface 372, and top surface 309.

Fins 302 may be formed by known fin fabrication techniques such as subtractive removal techniques that remove selective portions of substrate 400 and retain other portions of substrate 400 to thereby form fins 302. For example, a mask may be formed upon the upper surface of substrate 400. The mask may be patterned to expose underlying portions of substrate 400 while protecting other underlying portions of substrate 400. The exposed portions of substrate 400 are removed (e.g., by an etchant, or the like) and the protected portions of substrate 400 are retained and form the fins 302. Subsequently, the mask is removed from the fins 302.

Figure 10:
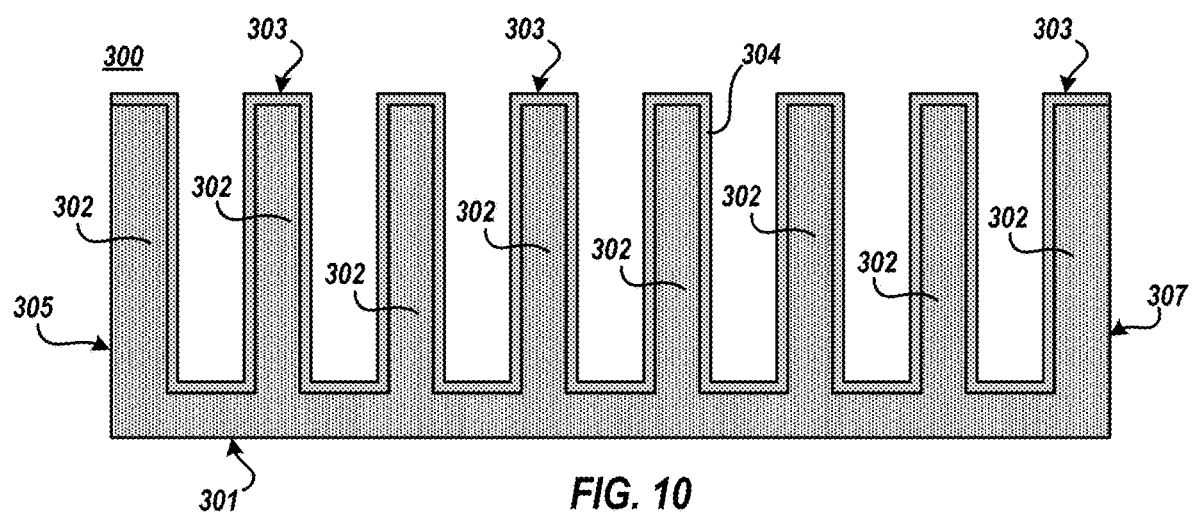
FIG. 10 depicts another fabrication stage of the process flow to form a semiconductor microcooler, according to one or more embodiments of the present invention.

FIG. 10 depicts another fabrication stage of the process flow to form a semiconductor microcooler, according to one or more embodiments of the present invention. At this fabrication stage, semiconductor microcooler 300 is formed. Semiconductor microcooler 300 is formed by forming metal layer 304 upon fins 302. Metal layer 304 may be formed by known metallization techniques. For example, metal layer 304 may be formed by deposition, plating, or the like. Metal layer 304 may be formed upon the front surface, rear surface, first sidewall surface 370, second sidewall surface 372, and top surface 309 of fins 302. In some embodiments, as depicted, metal layer 304 is not formed upon surface 301, 305, and/or 307. However, for clarity, metal layer 304 may alternatively be formed upon surface 301, 305, and/or 307 of finned semiconductor substrate 400'. In these implementations, surfaces 301, 305, and/or 307 of finned semiconductor substrate 400' are therefore metal.

Metal layer 304 may be a layer of metal formed from a metal or metal compound, such as a layer of copper, aluminum, tungsten, or like. In a preferred embodiment, metal layer 304 is a Cu metal layer. The thickness of metal layer 304 may be the same thickness of the associated fin 302. For example, the metal layer 304 may have a thickness ranging from 0.025 to 0.1 mm.

Semiconductor microcooler 300 may also include a front surface, rear surface, lower surface 301, first side surface 305, second side surface 307, and upper surface 303.

Figure 11:
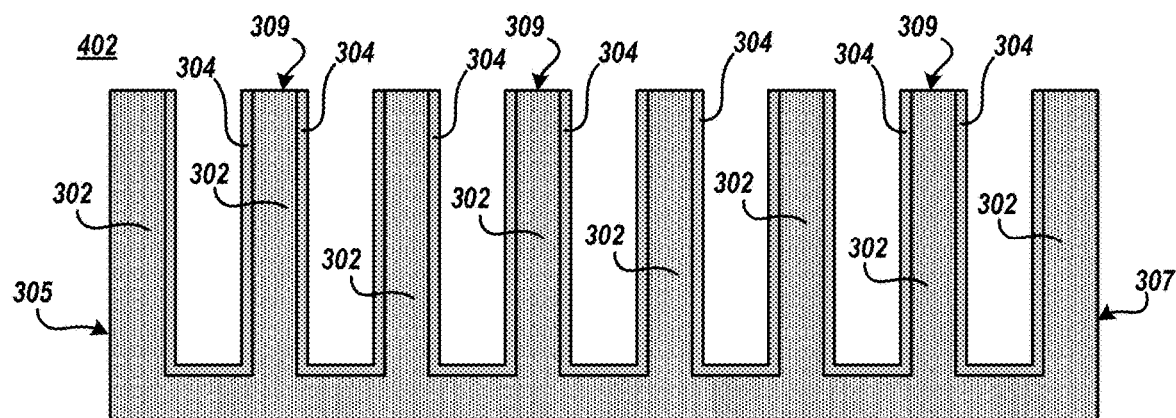
FIG. 11 depicts another fabrication stage of the process flow to form a semiconductor microcooler, according to one or more embodiments of the present invention.

FIG. 11 depicts another fabrication stage of the process flow to form a semiconductor microcooler, according to one or more embodiments of the present invention. At this fabrication stage, semiconductor microcooler 402 is formed. Semiconductor microcooler 402 may be formed by removing the metal layer 304 that is upon the upper surface 309 of each fin 302 of semiconductor microcooler 300. The metal layer 304 that is upon the upper surface 309 of each fin 302 may be removed by known substantive removal techniques. For example, a chemical mechanical polish (CMP) technique may remove the metal layer 304 that is upon the upper surface 309 of each fin 302. Generally, the metal layer 304 that is within the fin trenches of semiconductor microcooler 402 (i.e. upon the first sidewall surface 370, upon the second sidewall surface 372, and upon the lower surface of the fin trench) may be retained while the metal layer 304 locally upon the upper surface 309 of fins 302 is removed thereby exposing the upper surface 309 of fins 302.

Figure 12:
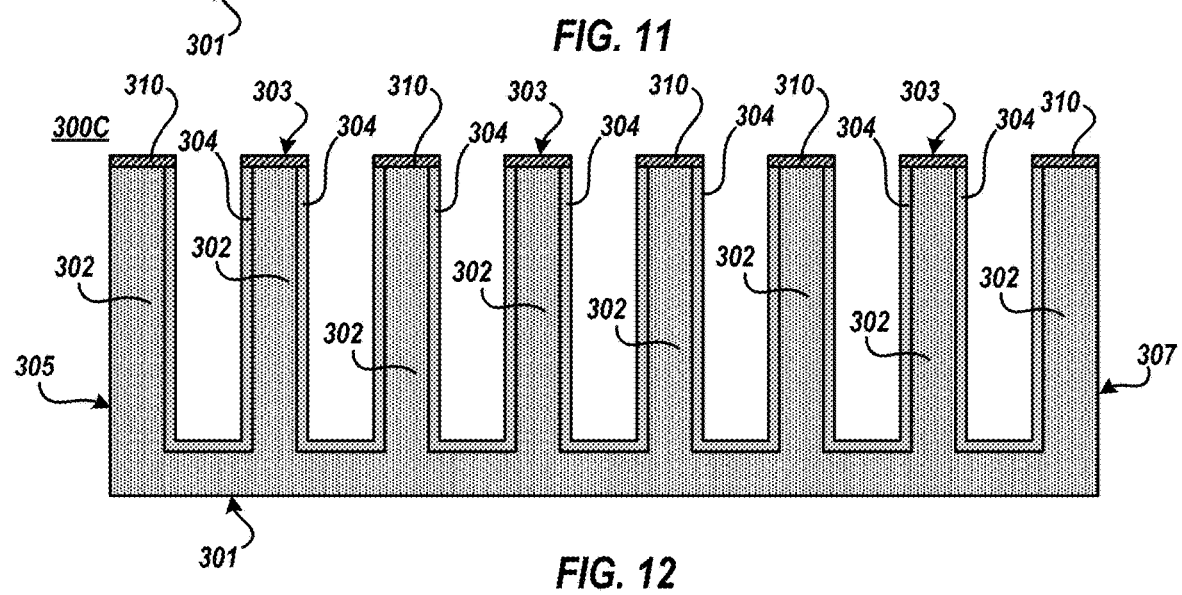
FIG. 12 depicts another fabrication stage of the process flow to form a semiconductor microcooler, according to one or more embodiments of the present invention.

FIG. 12 depicts another fabrication stage of the process flow to form a semiconductor microcooler, according to one or more embodiments of the present invention. At this fabrication stage, semiconductor microcooler 300C is formed. Semiconductor microcooler 300C may be formed by forming bonding layer 310 upon the exposed upper surface 309 of fins 302 of semiconductor microcooler 402. As depicted, bonding layer 310 may also be formed upon the upper surfaces of metal layer 304 of semiconductor microcooler 402.

In some implementations bonding layer 310 may be formed locally to the exposed upper surface 309 of fins 302 and/or upon the upper surfaces of metal layer 304 that are substantially coplanar (i.e. such surfaces are coplanar within an appropriate fabrication tolerance) with the upper surface 309 of the associated fin 302. In other implementations, a blanket bonding layer may be formed upon the exposed upper surface 309 of fins 302 and upon the metal layer 304. Subsequently, portions of the blanket bonding layer within the fin trenches are removed and the portions of the blanket bonding layer 304 upon the upper surface 309 of fins 302 and/or upon the upper surfaces of metal layer 304 that are substantially coplanar with the upper surface 309 of the associated fin 302 are retained as bonding layer 310.

Bonding layer 310 may be a layer of Indium, Tungsten, Titanium, Silicon Oxide, or the like. In a preferred embodiment, bonding layer is an Indium layer. Generally bonding layer 310 is formed of a material that has greater adherence relative to the material of fins 302. As such, semiconductor microcooler 300C that includes bonding layer 310 may be utilized in implementations where a stacked semiconductor microcooler is fabricated where the bonding layer 310 bonds the individual semiconductor microcoolers.

In some embodiments, the thickness of bonding layer 310 is the same as the thickness of the metal layer 304. Bonding layer 310 may be about, but is not limited to, 0.050 mm For example, the bonding layer 310 may have a thickness ranging from 0.0255 mm to about 0.15 mm.

Semiconductor microcooler 300C may also include a front surface, rear surface, lower surface 301, first side surface 305, second side surface 307, and upper surface 303.

Figure 13:
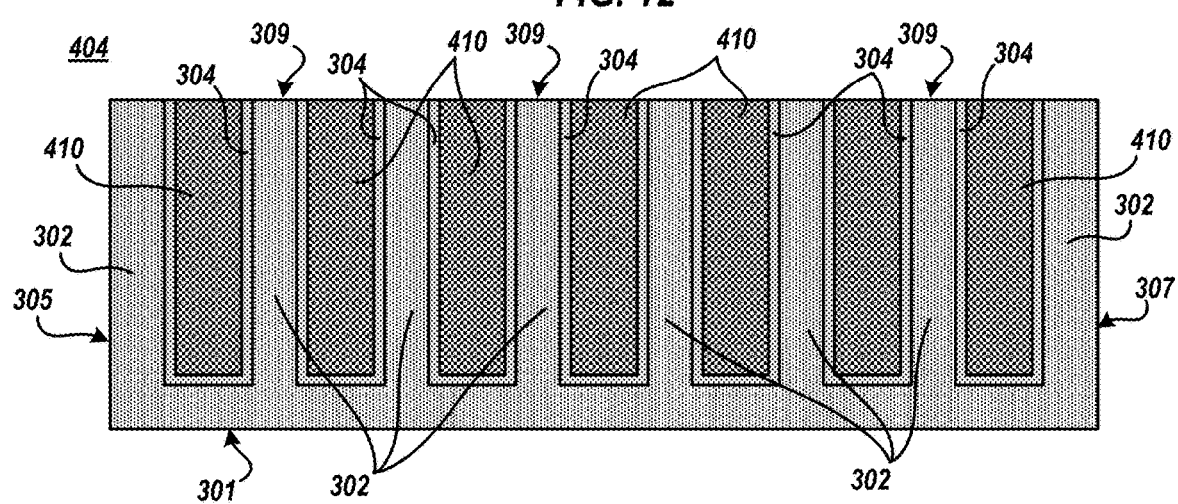
FIG. 13 depicts another fabrication stage of the process flow to form a semiconductor microcooler, according to one or more embodiments of the present invention.

FIG. 13 depicts another fabrication stage of the process flow to form a semiconductor microcooler, according to one or more embodiments of the present invention. At this fabrication stage, semiconductor microcooler 404 is formed. Semiconductor microcooler 404 includes a filler 410 within each fin trench. Semiconductor microcooler 404 may be formed by forming filler 410 within the fin trenches of semiconductor microcooler 402. Filler 410 is a metal with a melting point above ambient and lower to the melting point of the metal of metal layer 304. Filler 410 may generally provide mechanical support, structural stability, rigidity, or the like when formed within the fin trenches.

Filler 410 may be formed by known fabrication techniques such as deposition, plating, or the like. In one implementation, a filler 410 is formed upon the metal layer 304 within and filling the fin trenches. In another implementation, a blanket filler layer is formed upon the metal layer 304 and upon the fins 302. Excess blanket filler layer may be removed with a polishing technique, e.g., a CMP that stops at surface 309 of the fins 302. Residual blanket filler layer material is maintained within the fin trenches, thereby forming fillers 410.

The upper surface of each filler 410 may be substantially coplanar with the upper surface 309 of the fins 302.

Figure 14:
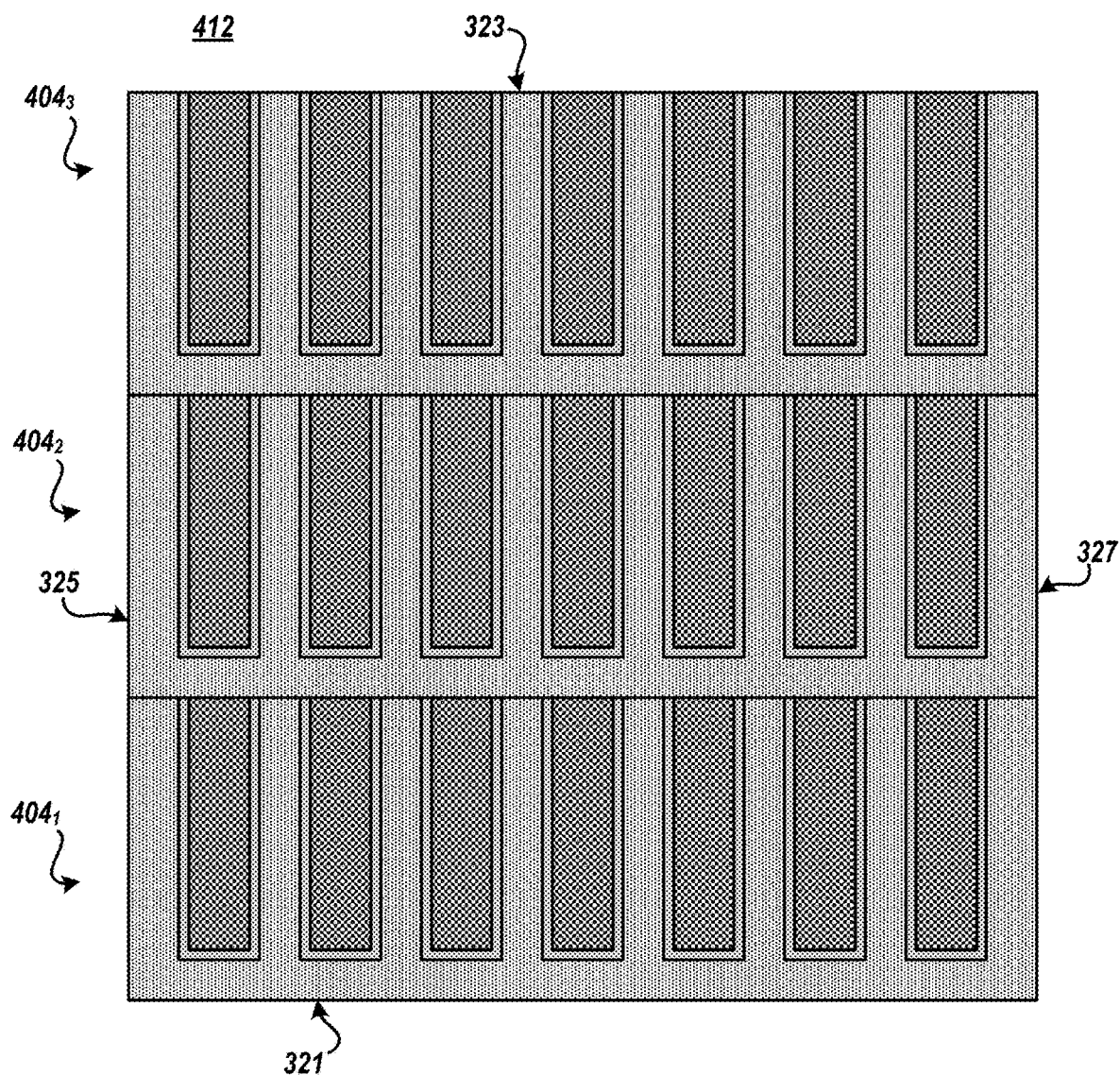
FIG. 14 depicts another fabrication stage of the process flow to form a semiconductor microcooler, according to one or more embodiments of the present invention.

FIG. 14 depicts another fabrication stage of the process flow to form a semiconductor microcooler, according to one or more embodiments of the present invention. At the present fabrication stage, stacked semiconductor microcooler 412 is formed by connecting two or more semiconductor microcoolers 404.

Stacked semiconductor microcooler 412 includes a plurality of stacked semiconductor microcoolers 404. For example, stacked semiconductor microcooler 412 includes a semiconductor microcooler $404_1$, semiconductor microcooler $404_2$, and semiconductor microcooler $404_3$. Semiconductor microcooler $404_2$ is stacked upon semiconductor microcooler $404_1$. Semiconductor microcooler $404_3$ is stacked upon semiconductor microcooler $404_2$. For clarity, though three semiconductor microcoolers 404 are shown stacked, stacked semiconductor microcooler 412 may include two or more semiconductor microcoolers 404 stacked relative each other.

The plurality of stacked semiconductor microcooler 404 may have the same orientation, as is depicted, whereby each lower surface 301 of each semiconductor microcooler 404 is facing the same direction. In such implementation, the top surface of a semiconductor microcooler 404 may be bonded and thermally connected to the lower surface 301 of another semiconductor microcooler 404. The semiconductor microcooler 404 may be stacked such that the fins 302, fin trenches, and fillers 410 of the semiconductor microcoolers 404 are vertically aligned. First side surface 325 may be formed by coplanar first side surfaces 305 of each semiconductor microcooler 404. Likewise, second side surface 327 may be formed by coplanar second side surfaces 307 of each semiconductor microcooler 404.

Stacked semiconductor microcooler 300B, as is shown in FIG. 5, may be formed by heating stacked semiconductor microcooler 404 to a temperature above the melting point of fillers 410 such that the material of fillers 410 is flows (i.e., into and out of the page) out of the fin trenches. Thus, after the removal of fillers 410, the fin trenches of stacked semiconductor microcooler 300B are open or void of substantial blockages that would prevent liquid coolant to flow 210 therethrough.

Figure 15:
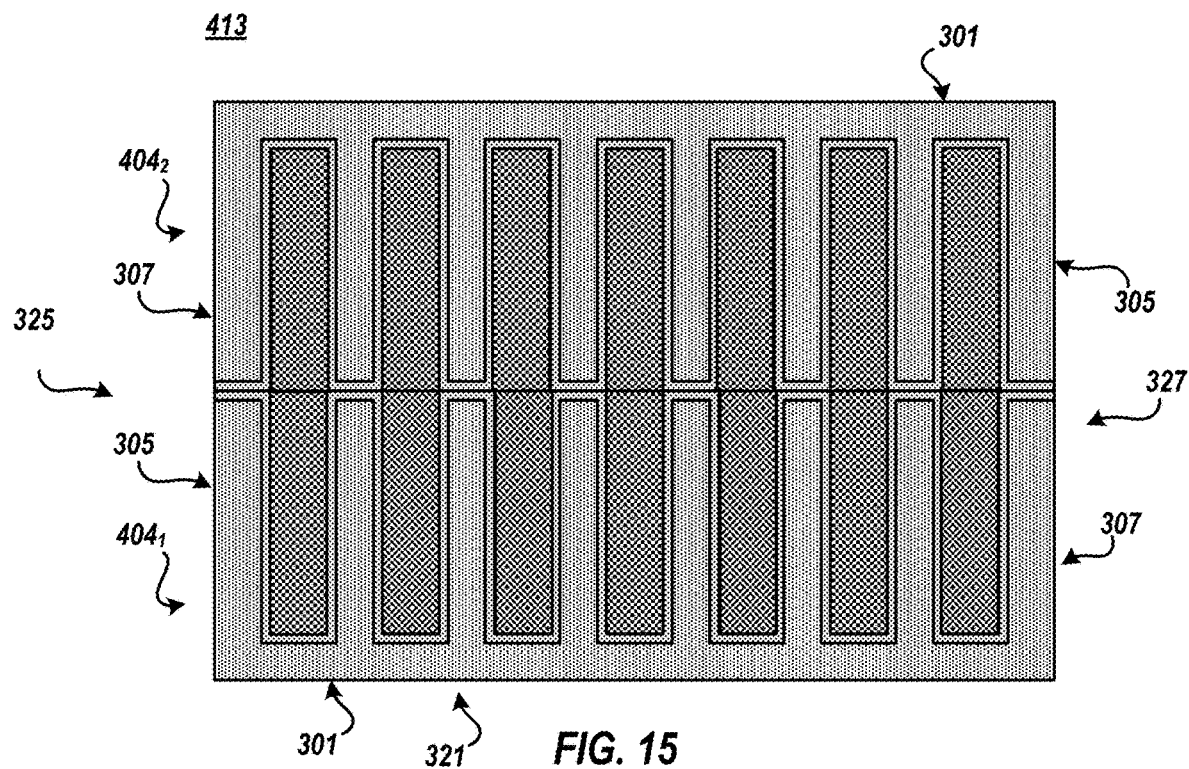
FIG. 15 depicts another fabrication stage of the process flow to form a semiconductor microcooler, according to one or more embodiments of the present invention.

FIG. 15 depicts another fabrication stage of the process flow to form a semiconductor microcooler, according to one or more embodiments of the present invention. At the present fabrication stage, stacked semiconductor microcooler 413 is formed by connecting semiconductor microcooler $404_1$ and semiconductor microcooler $404_2$.

Semiconductor microcooler $404_1$ and semiconductor microcooler $404_2$ have a different orientation whereby lower surfaces 301 of semiconductor microcooler $404_1$ and semiconductor microcooler $404_2$ face away from each other. In such implementation, the top surface 303 of semiconductor microcooler $404_1$ is be bonded and thermally connected to the top surface 303 of semiconductor microcooler $404_2$. The fins 302, fin trenches, and fillers 410 of semiconductor microcooler $404_1$ and semiconductor microcooler $404_2$ are vertically aligned, thereby increasing (e.g. doubling, etc.) the size of the fin trenches that separate the fins 302. First side surface 325 may be formed by a coplanar first side surface 305 of semiconductor microcooler $404_1$ and second side surface 307 of semiconductor microcooler $404_2$. Likewise, second side surface 327 may be formed by a coplanar second side surface 307 of the semiconductor microcooler $404_1$ and the first side surface 307 of the semiconductor microcooler $404_2$.

A stacked semiconductor microcooler 413' may be formed by heating stacked semiconductor microcooler 413 to a temperature above the melting point of fillers 410 such that the material of fillers 410 flows (i.e., into and out of the page) out of the fin trenches. Thus, after the removal of fillers 410, the fin trenches of stacked semiconductor microcooler 413' are open or void of substantial blockages that would prevent liquid coolant to flow 210 therethrough. The stacked semiconductor microcooler 413' may be thermally connected to one or more surfaces within conduit region 212, as described with reference to the other semiconductor microcoolers depicted herein. Stacked semiconductor microcooler 413' may be depicted as stacked semiconductor microcooler 413, shown in FIG. 15, without fillers 410 within the fin trenches.

Figure 16:
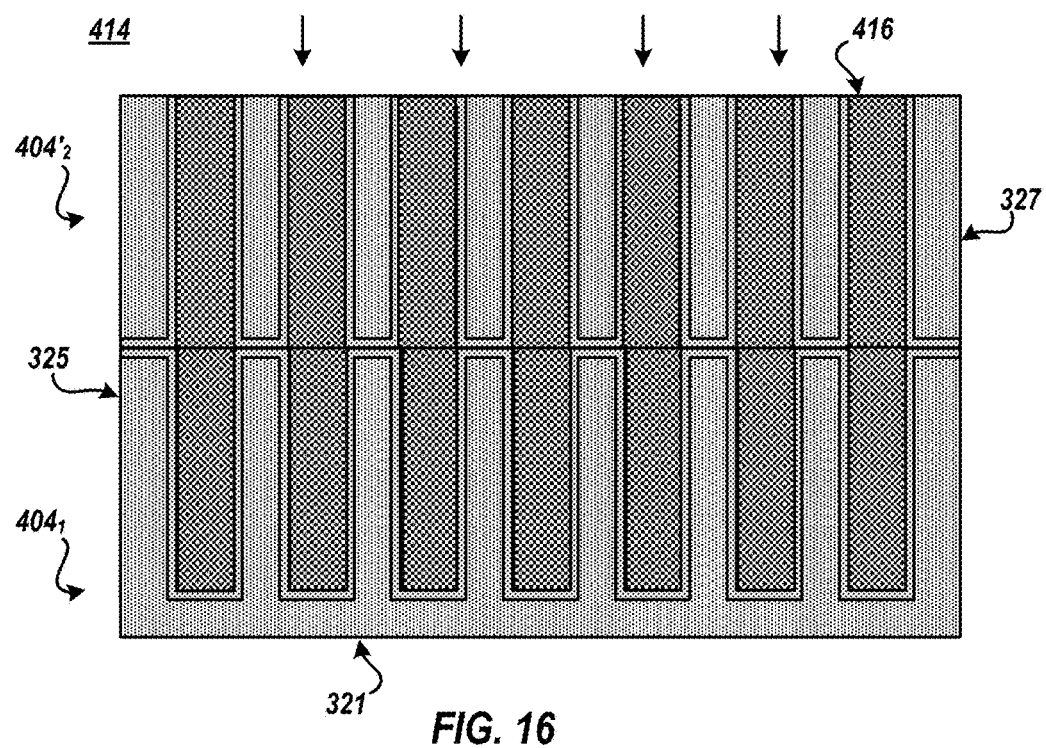
FIG. 16 depicts another fabrication stage of the process flow to form a semiconductor microcooler, according to one or more embodiments of the present invention.

FIG. 16 depicts another fabrication stage of the process flow to form a semiconductor microcooler, according to one or more embodiments of the present invention. At the present fabrication stage, stacked semiconductor microcooler 414 is formed by polishing the backside of semiconductor microcooler $404_2$ thereby forming polished semiconductor microcooler $404_2'$.

The backside of semiconductor microcooler $404_2$ may be polished with a CMP technique that removes the backside of semiconductor microcooler $404_2$ to a surface 416 that is coplanar with the backside surface of filler 410. In other words, the semiconductor bulk substrate 400 material and the metal layer 310 material on the backside of semiconductor microcooler $404_2$ is polished away until the fillers 410 within the fin trenches are exposed.

Figure 17:
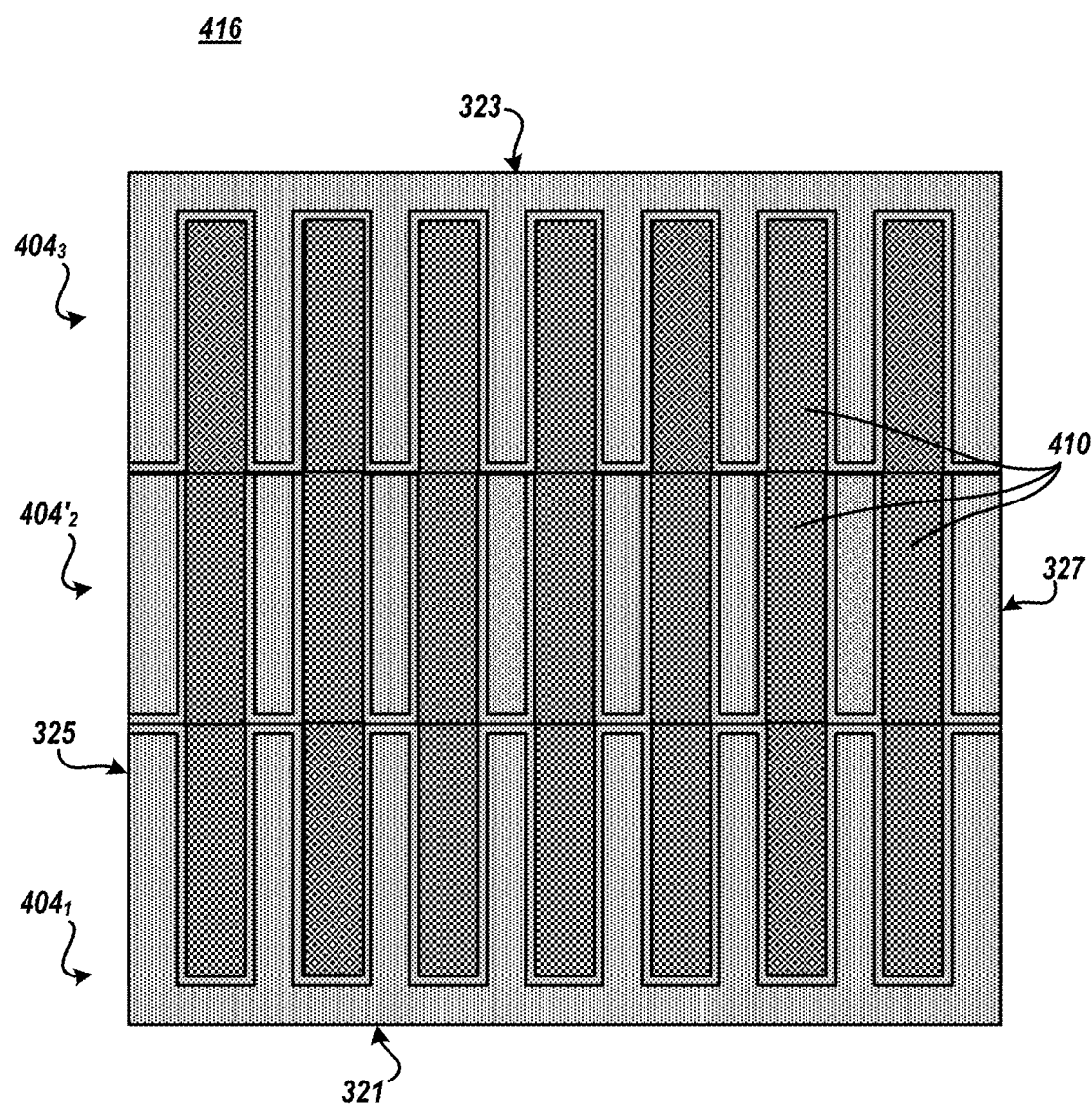
FIG. 17 depicts another fabrication stage of the process flow to form a semiconductor microcooler, according to one or more embodiments of the present invention.

FIG. 17 depicts another fabrication stage of the process flow to form a semiconductor microcooler, according to one or more embodiments of the present invention. At the present fabrication stage, stacked semiconductor microcooler 416 is formed by connecting semiconductor microcooler $404_3$ and stacked semiconductor microcooler 414.

The polished backside surface of semiconductor microcooler $404_2$ is bonded and thermally connected to the top surface 303 of semiconductor microcooler $404_3$. The fins 302, fin trenches, and fillers 410 of semiconductor microcooler $404_3$ and such features of stacked semiconductor microcooler 414 are vertically aligned, thereby increasing (e.g. tripling, etc.) the size of the fin trenches that separate the fins 302. First side surface 325 may be formed by coplanar side surfaces and second side surface 327 may be formed by coplanar side surfaces.

Stacked semiconductor microcooler 300E, as depicted in FIG. 7, may be formed by heating stacked semiconductor microcooler 416 to a temperature above the melting point of fillers 410 such that the material of fillers 410 flows (i.e., into and out of the page) out of the fin trenches. Thus, after the removal of fillers 410, the fin trenches of stacked semiconductor microcooler 300E are open or void of substantial blockages that would prevent liquid coolant to flow 210 therethrough.

Figure 18:
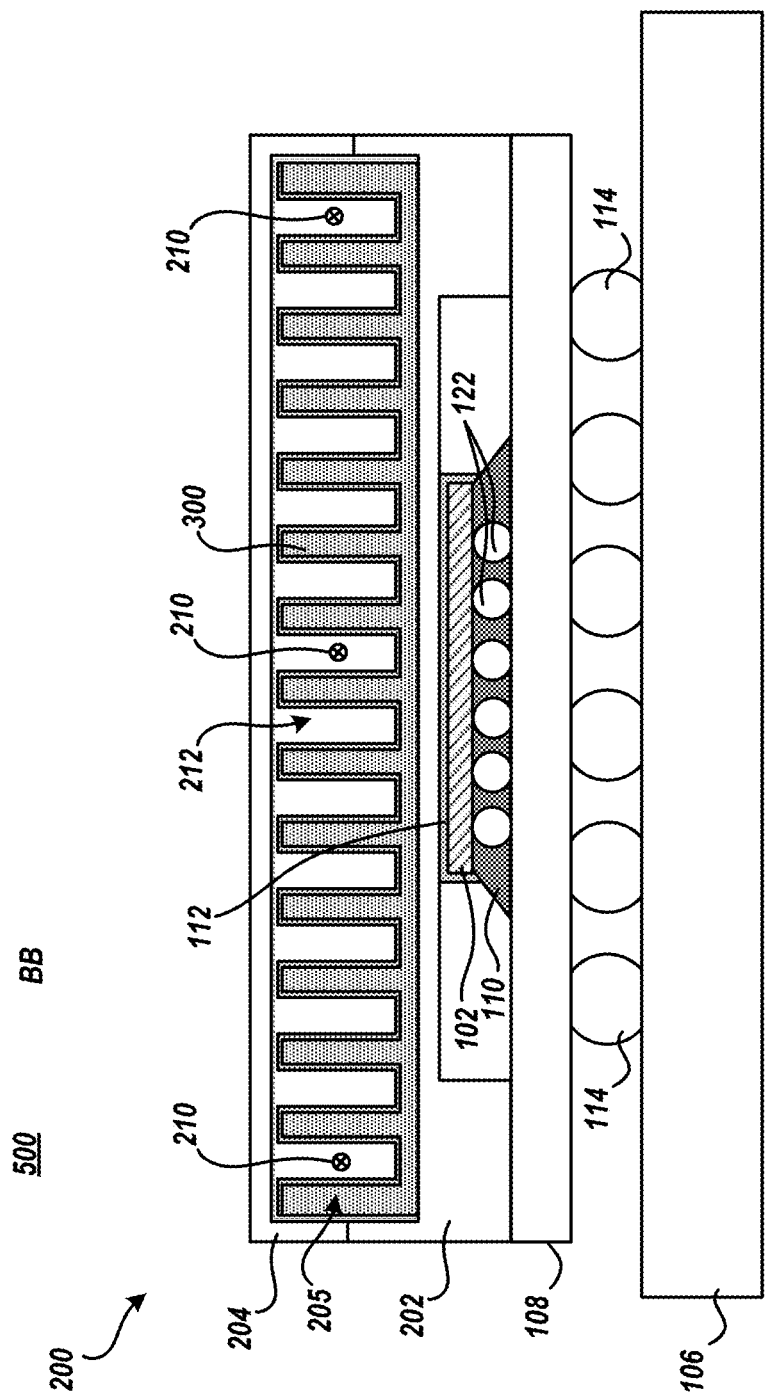
FIG. 18 depicts an electronic system comprising an IC chip that is cooled by a liquid cooling system that utilizes one or more embodiments of the present invention.

FIG. 18 depicts an electronic system 500 comprising an IC chip 102 that is cooled by a liquid cooling system that utilizes one or more embodiments of the present invention. Electronic system 500 may be for example a computer, kiosk, server, mobile device, tablet, and the like. System 500 includes liquid cooled package 200. To assist in the removal of heat from chip 102, package 200 is thermally connected to chip 102 via thermal interface material 112. As such, heat generated from the operation of IC chip 102 is transferred into first housing 202 and the second housing 204.

One or more semiconductor microcoolers (e.g., $300_1$, $300_2$, and $300_3$) are thermally connected to one or more surfaces of first housing 202 and/or the second housing 204 that defines conduit region 212, within the cavity 205, to increase the surface area thereof. For example, surface 301 of each of the one or more semiconductor microcoolers is thermally connected to surface 203 of the first housing 202. In one embodiment, one or more microcooler is thermally connected to the bottom surface and applicable side surfaces of the one or more microcooler(s) nearest the side surfaces of the cavity 205 are within a fin width from such surfaces and each of the upper surfaces of the microcooler(s) are within a layer 304 thickness from the upper surface of cavity 205. For example, the left side surface of microcooler 300 is within a fin width of the left side surface of cavity 205, the right side surface of microcooler 300 is within a fin width of the right side surface of cavity 205, and the upper surface of microcooler 300 is within a layer 304 thickness from the upper surface of cavity 205.

Heat from the one or more surfaces of the first housing 202 and/or the second housing 204 is transferred into the fins 302 and into the metal layer 304 of semiconductor microcooler(s). The semiconductor microcooler(s) may be positioned such that the fins 302 are generally parallel to the direction of the liquid coolant flow 210 to promote liquid coolant flowing through the fin trenches. Generally, when semiconductor microcooler(s) are thermally connected to the one or more surfaces of first housing 202 and/or the second housing 204, the liquid coolant flows within the fin trenches. In this way, with the addition of the one or more semiconductor microcoolers within the conduit region 212, heat is transferred relatively more efficiently from the first housing 202 and/or the second housing 204 into the liquid coolant flow 210.

Figure 19:
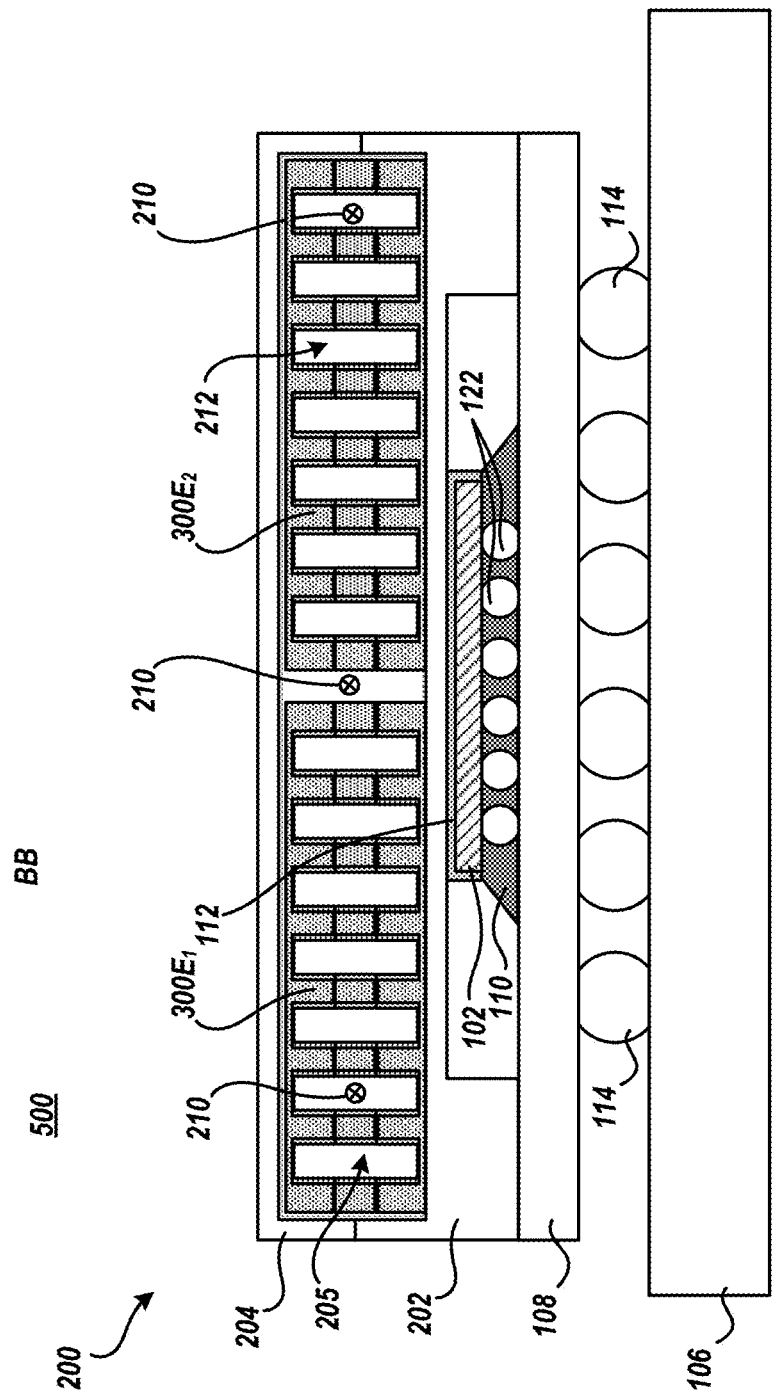
FIG. 19 depicts an electronic system comprising an IC chip that is cooled by a liquid cooling system that utilizes one or more embodiments of the present invention.

FIG. 19 depicts an electronic system 500 comprising an IC chip 102 that is cooled by a liquid cooling system that utilizes one or more embodiments of the present invention. In the depicted example, one or more semiconductor microcoolers (e.g., $300E_1$, $300E_2$, and $300E_3$) are thermally connected to one or more surfaces of first housing 202 and/or the second housing 204 that defines conduit region 212, within the cavity 205, to increase the surface area thereof. For example, surface 321 of each of the semiconductor microcooler(s) is thermally connected to surface 203 of the first housing 202. In one embodiment, one or more microcooler is thermally connected to the bottom surface and applicable side surfaces of the one or more microcooler(s) nearest the side surfaces of the cavity 205 are within a fin width from such surfaces and each of the upper surfaces of the microcooler(s) are within a layer 304 thickness from the upper surface of cavity 205. For example, the left side surface of the microcooler $300E_1$ is within a fin width of the left side surface of cavity 205, the right side surface of microcooler $300E_2$ is within a fin width of the right side surface of cavity 205, and the upper surface of microcooler $300E_1$ and $300_2$ is within a layer 304 thickness from the upper surface of cavity 205.

Heat from the one or more surfaces of the first housing 202 and/or the second housing 204 is transferred into the fins 302 and into the metal layer 304 of semiconductor microcooler(s). The semiconductor microcooler(s) may be positioned such that the fins 302 are generally parallel to the direction of the liquid coolant flow 210 to promote liquid coolant flowing through the fin trenches. Generally, when semiconductor microcooler(s) are thermally connected to the one or more surfaces of first housing 202 and/or the second housing 204, the liquid coolant flows within the fin trenches. In this way, with the addition of the one or more semiconductor microcooler(s) within conduit region 212, heat is transferred relatively more efficiently from the first housing 202 and/or the second housing 204 into the liquid coolant flow 210.

For clarity, though semiconductor microcoolers 300 and semiconductor microcoolers $300E_1$ and $300E_2$ are depicted within an electronic system 500 in FIGS. 18 and 19, respectively, other semiconductor microcoolers (or any combination thereof) may so be included therein. For example, semiconductor microcoolers 300B, 300C, 300D, 402, 413', or the like may be thermally connected to one or more surfaces of first housing 202 and/or the second housing 204 that defines conduit region 212, within the cavity 205, to increase the surface area thereof to more efficiently transfer heat into the liquid coolant flow 210.

Further, for clarity, though a semiconductor microcooler may be depicted in a Figure without an element compared to another semiconductor microcooler depicted in a different Figure, the former semiconductor microcooler may include such feature. For example, semiconductor microcoolers $404_1$, $404_2$, and/or $404_3$ depicted in FIG. 17 may include bonding layer 310, though bonding layer 310 is not depicted in FIG. 17.

Figure 20:
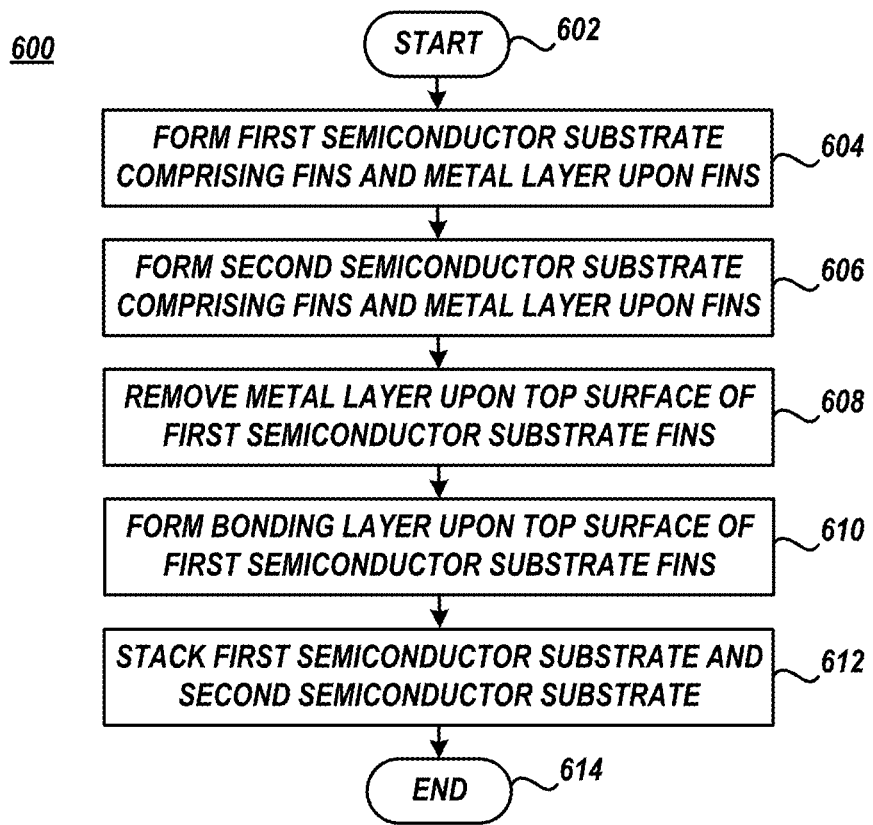
FIG. 20 depicts a method for fabricating a semiconductor microcooler, according to one or more embodiments of the present invention.

FIG. 20 depicts a method 600 for fabricating a semiconductor microcooler, according to one or more embodiments of the present invention. Method 600 begins at block 602 and continues with forming a first finned semiconductor substrate that includes at least a plurality of fins and a metal layer upon the fins (block 604). For example, fins 302 are formed in a first bulk semiconductor substrate 400 and metal layer 304 is formed upon the fins 302 to form a first semiconductor microcooler $300_1$, or in other words, to form a first finned semiconductor substrate that includes at least a plurality of fins and a metal layer upon the fins.

Method 600 may continue with forming a second finned semiconductor substrate that includes at least a plurality of fins and a metal layer upon the fins (block 606). For example, fins 302 are formed in a second bulk semiconductor substrate 400 and metal layer 304 is formed upon the fins 302 to form a second semiconductor microcooler $300_2$, or in other words, to form a second finned semiconductor substrate that includes at least a plurality of fins and a metal layer upon the fins.

Method 600 may continue with removing the metal layer upon the upper surface of the fins of the first finned semiconductor substrate (block 608). For example, the metal layer 304 locally upon the upper surface 309 of the fins 302 of semiconductor microcooler $300_1$ are removed to expose upper surface 309 of the fins 302 of semiconductor microcooler $300_1$ while the metal layer 304 on the one or more side surfaces of the fins 302 remain.

Method 600 may continue with forming a bonding layer upon the upper surface of the fins of the first finned semiconductor substrate (block 610). For example, bonding layer 310 is formed locally upon the upper surface 309 of the fins 302 of semiconductor microcooler $300_1$ and upon the upper surfaces of the metal layer 304 that is on the one or more side surfaces of the fins 302 to form semiconductor microcooler $300C_1$.

Method 600 may continue with stacking the first finned semiconductor substrate and the second finned semiconductor substrate (block 612). For example, semiconductor microcooler $300C_1$ is bonded and thermally connected to semiconductor microcooler $300_2$ via the bonding layer 310 that is upon the upper surface 309 of the fins 302 of semiconductor microcooler $300_1$. Method 600 ends at block 614.

Figure 21:
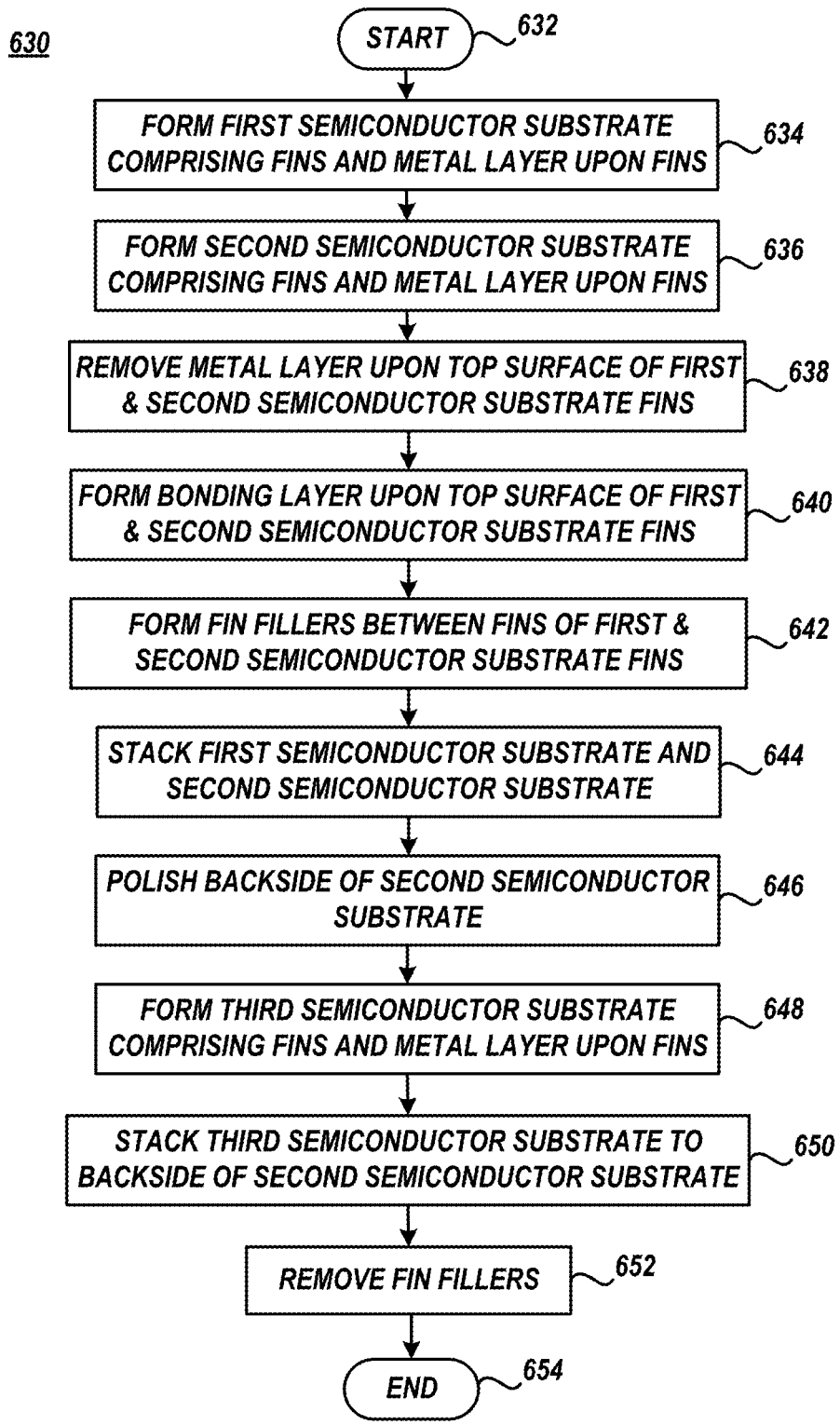
FIG. 21 depicts a method for fabricating a semiconductor microcooler, according to one or more embodiments of the present invention.

FIG. 21 depicts a method 630 for fabricating a semiconductor microcooler, according to one or more embodiments of the present invention. Method 630 begins at block 632 and continues with forming a first finned semiconductor substrate that includes at least a plurality of fins and a metal layer upon the fins (block 634). For example, fins 302 are formed in a first bulk semiconductor substrate 400 and metal layer 304 is formed upon the fins 302 to form a first semiconductor microcooler $300_1$, or in other words, to form a first finned semiconductor substrate that includes at least a plurality of fins and a metal layer upon the fins.

Method 630 may continue with forming a second finned semiconductor substrate that includes at least a plurality of fins and a metal layer upon the fins (block 636). For example, fins 302 are formed in a second bulk semiconductor substrate 400 and metal layer 304 is formed upon the fins 302 to form a second semiconductor microcooler $300_2$, or in other words, to form a second finned semiconductor substrate that includes at least a plurality of fins and a metal layer upon the fins.

Method 630 may continue with removing the metal layer upon the upper surface of the fins of the first finned semiconductor substrate (block 638). For example, the metal layer 304 locally upon the upper surface 309 of the fins 302 of semiconductor microcooler $300_1$ are removed to expose upper surface 309 of the fins 302 of semiconductor microcooler $300_1$ while the metal layer 304 on the one or more side surfaces of the fins 302 remain.

Method 630 may continue with forming a bonding layer upon the upper surface of the fins of the first finned semiconductor substrate and upon the fins of the second finned semiconductor substrate (block 640). For example, a first bonding layer 310 is formed locally upon the upper surface 309 of the fins 302 of semiconductor microcooler $300_1$ and upon the upper surfaces of the metal layer 304 that is on the one or more side surfaces of the fins 302 to form semiconductor microcooler $300C_1$ and a second bonding layer 310 is formed locally upon the upper surface 309 of the fins 302 of semiconductor microcooler $300_2$ and upon the upper surfaces of the metal layer 304 that is on the one or more side surfaces of the fins 302 to form semiconductor microcooler $300C_2$.

Method 630 may continue with forming a filler within each fin trench that separates the neighboring fins of the fins of the first finned semiconductor substrate and within each fin trench that separates the neighboring fins of the fins of the second finned semiconductor substrate (block 642). For example, a filler 410 is formed within upon the metal layer 304 upon the sidewalls of fins 302 of semiconductor microcooler $300_1$ within the fin trench that separates neighboring fins 302. Likewise, a filler 410 is formed within upon the metal layer 304 upon the sidewalls of fins 302 of semiconductor microcooler $300_2$ within the fin trench that separates neighboring fins 302.

Method 630 may continue with stacking the first finned semiconductor substrate and the second finned semiconductor substrate (block 644). For example, stacked semiconductor microcooler 413 may be formed by stacking the semiconductor microcooler $300_2$ upon semiconductor microcooler $300_1$.

Method 630 may continue with polishing the backside of the second finned semiconductor substrate (block 644). For example, the backside of semiconductor microcooler 300$_2$ is polished to expose the fillers 410 that separate the neighboring fins 302 of the semiconductor microcooler 300$_2$.

Method 630 may continue with forming a third finned semiconductor substrate that includes at least a plurality of fins and a metal layer upon the fins (block 648). For example, fins 302 are formed in a third bulk semiconductor substrate 400 and metal layer 304 is formed upon the fins 302 to form a third semiconductor microcooler 300$_3$, or in other words, to form a third finned semiconductor substrate that includes at least a plurality of fins and a metal layer upon the fins.

Method 630 may continue with stacking the third finned semiconductor substrate to the polished backside of the second finned semiconductor substrate (block 650). For example, third semiconductor microcooler 300$_3$ is stacked upon the polished backside of the semiconductor microcooler 300$_2$ to form stacked semiconductor microcooler 416.

Method 630 may continue with removing the fillers within each fin trench that separates the neighboring fins (block 652). For example, fillers 410 are removed from the fin trenches of semiconductor microcoolers 300$_1$, 300$_2$, and 300$_3$. Method 630 ends at block 654.

FIG. 22, FIG. 23, and FIG. 24 depict a stacked semiconductor microcooler 700, according to one or more embodiments of the present invention. Stacked semiconductor microcooler 700, as depicted, includes stacked semiconductor microcooler 300B which includes microcooler 300$_1$, microcooler 300$_2$, and microcooler 300$_3$, though stacked microcooler 700 may include other microcooler arrangements, such as stacked semiconductor microcooler 300E, or the like.

Stacked semiconductor microcooler 700 includes inlet/outlet passages 702 through the stacked semiconductor microcooler 700. Inlet/outlet passages 702 may be referred herein as access passage(s). For example, inlet/outlet passages 702 may extend from the surface 309 of microcooler 300$_3$, as depicted in FIG. 24, to bottom of the fin trench of microcooler 300$_1$. One of the inlet/outlet passages 702 may be configured as an inlet where liquid coolant may be introduced into stacked semiconductor microcooler 700. One of the inlet/outlet passages 702 may be configured as an outlet where liquid coolant may be expelled from stacked semiconductor microcooler 700. In some embodiments there may be multiple inlet passages and multiple outlet passages within stacked semiconductor microcooler 700.

Access passage(s) may be formed within each microcooler prior to stacking such microcoolers by removing a portion of one or more fins and one or more portions of the bulk substrate adjacent to the fin(s). In such embodiment, the microcoolers may be positioned with respect thereto to align the access passages. Access passage(s) may be formed within each microcooler after stacking such microcoolers by removing aligned portions of respective one or more fins and aligned portions of the respective bulk substrates adjacent to the associated fin(s).

Inlet/outlet passages 702 generally allows flow access to each level of the stacked semiconductor microcooler 700. For example, inlet passage 702 allows for coolant to pass through semiconductor microcooler 303$_3$ to the underlying semiconductor microcooler 303$_2$. Likewise inlet passage 702 allows for coolant to pass through semiconductor microcooler 303$_2$ to the underlying semiconductor microcooler 303$_1$. In this manner, inlet passage 702 allows for coolant to flow to and through each level of the stacked semiconductor microcooler 700. Similarly, outlet passage 702 allows for coolant exiting semiconductor microcooler 303$_2$ to pass through the above semiconductor microcooler 303$_3$. Likewise outlet passage 702 allows for coolant exiting semiconductor microcooler 303$_1$ to pass through both the above semiconductor microcoolers 303$_2$ and 303$_3$. In this manner, outlet passage 702 allows for coolant to flow out of each level of the stacked semiconductor microcooler 700.

Figure 25:
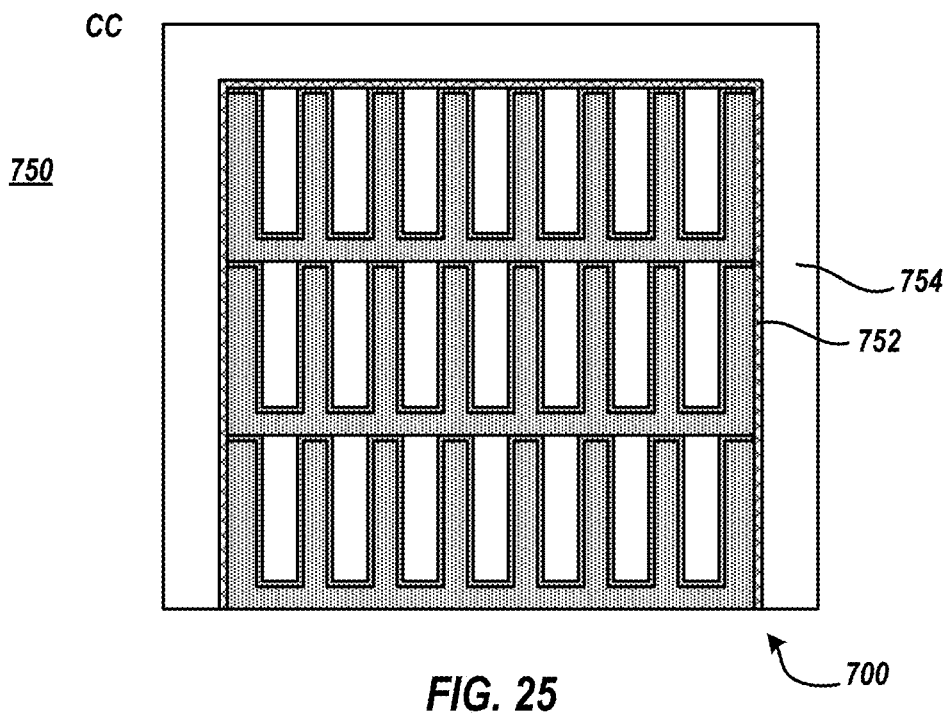
FIG. 25 and FIG. 26 depicts stacked semiconductor microcooler assembly, according to one or more embodiments of the present invention.
Figure 26:
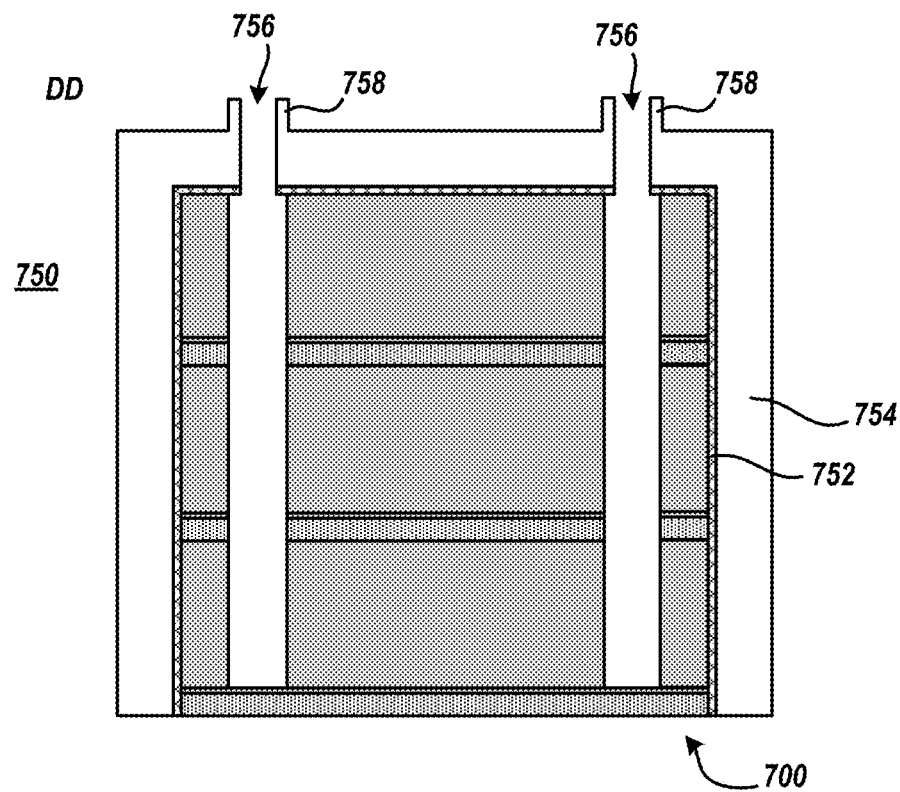

FIG. 25 and FIG. 26 depicts stacked semiconductor microcooler assembly 750, according to one or more embodiments of the present invention. Stacked semiconductor microcooler assembly 750 includes stacked semiconductor microcooler 700 and frame 754. Stacked semiconductor microcooler assembly 750 may also include a liner 752 between the stacked semiconductor microcooler 700 and frame 754. Generally, stacked semiconductor microcooler 700 is configured to fit within frame 754 such that one or more sidewalls (i.e., front, rear, left, right, and the like) of stacked semiconductor microcooler 700 contacts an inner respective sidewall of the frame 754. Frame 754 may be fabricated from metal, plastic, or the like. Liner 752 may be fabricated from a rubber or other such compliant material and may be, for example, a viton pad. Frame 754 is generally open on one side such a semiconductor microcooler 700 surface is exposed such that it may be directly connected to an integrated circuit chip. For example, as depicted, frame 754 and stacked semiconductor microcooler 700 are positioned together such that surface 301 of microcooler 300$_1$ is exposed such that it may be directly connected to an integrated circuit chip.

Frame 754 includes an inlet/outlet 756 generally aligned with inlet/outlet passages 702. One of the inlet/outlet 756 may be configured as an inlet where liquid coolant may be introduced into stacked semiconductor microcooler 700 through frame 754. One of the inlet/outlet 756 may be configured as an outlet where liquid coolant may be expelled from stacked semiconductor microcooler 700 through frame 754. In some embodiments there may be multiple inlets and multiple outlets within frame 754 each associated with a respective inlet or outlet passage of stacked semiconductor microcooler 700. Frame 756 may also include a flange 758 that is configured to connect with a liquid coolant conduit.

Figure 27:
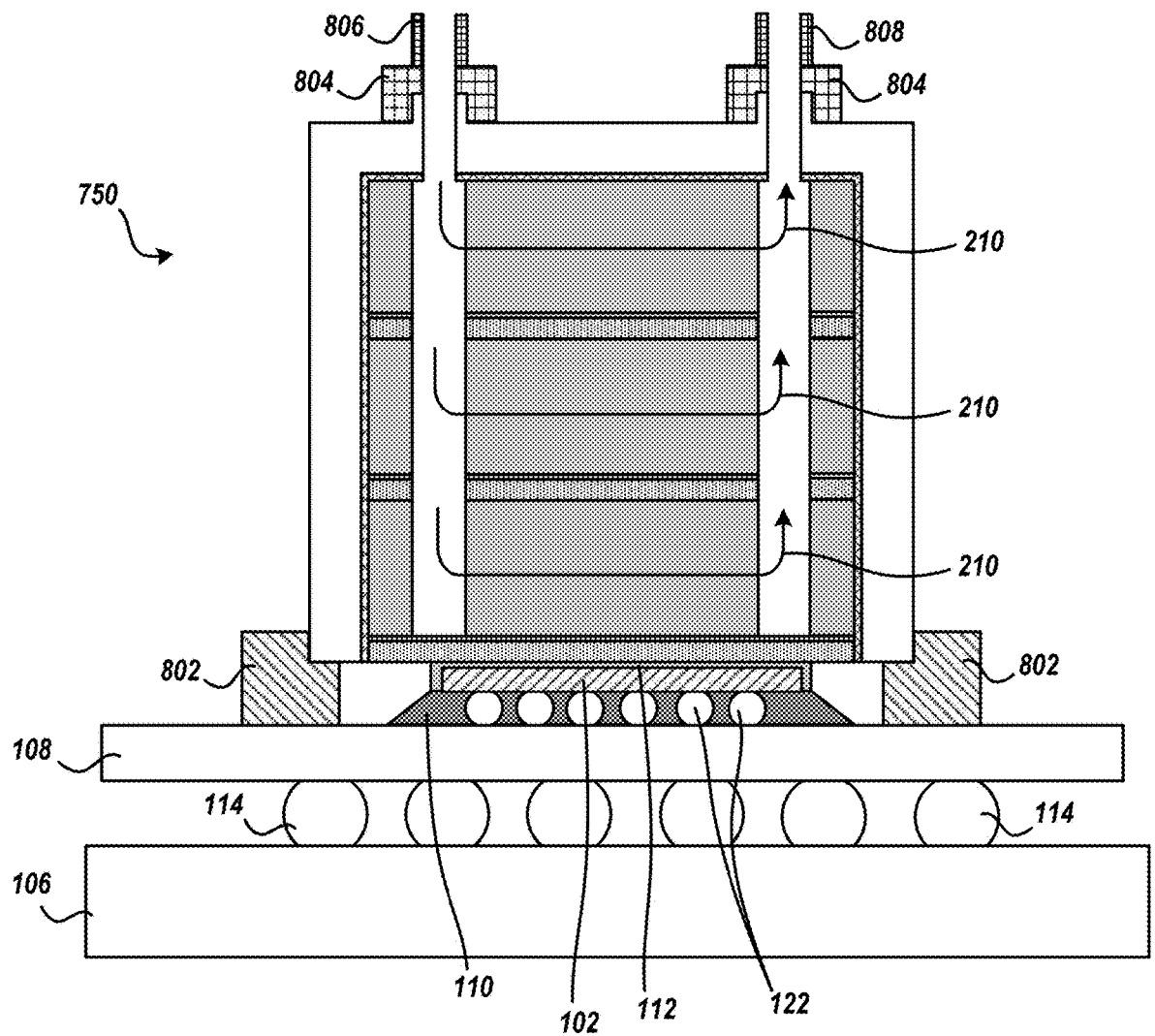
FIG. 27 depicts an electronic system comprising an IC chip that is cooled by a liquid cooling system that utilizes one or more embodiments of the present invention.

FIG. 27 depicts an electronic system 800 comprising an IC chip 102 that is cooled by a liquid cooling system that utilizes one or more embodiments of the present invention. Electronic system 800 may be for example a computer, kiosk, server, mobile device, tablet, and the like. System 800 includes stacked semiconductor microcooler assembly 750. To assist in the removal of heat from chip 102, the exposed surface of stacked semiconductor microcooler 700 is thermally connected to chip 102 via thermal interface material 112. As such, heat generated from the operation of IC chip 102 is transferred into stacked semiconductor microcooler 700.

Heat from the one or more surfaces of the semiconductor microcoolers 300$_1$, 300$_2$, and 300$_3$ of stacked semiconductor microcooler 700 is transferred into the fins 302 and into the metal layer 304. The semiconductor microcoolers 300$_1$, 300$_2$, and 300$_3$ may be positioned such that the fins 302 are generally parallel to the direction of the liquid coolant flow 210 to promote liquid coolant flowing through the fin trenches. Generally, when semiconductor microcoolers 300$_1$, 300$_2$, and 300$_3$ are thermally connected to the one or more surfaces of first housing 202 and/or the second housing 204, the liquid coolant flows within the fin trenches. In this way, with the addition of the one or more semiconductor microcoolers 300$_1$, 300$_2$, and 300$_3$, heat is transferred relatively more efficiently from the first housing 202 and/or the second housing 204 into the liquid coolant flow 210.

Liquid coolant flow 210 may be induced by a cooled coolant entering stacked semiconductor microcooler 700 from within hose 806. Hose 806 may be attached to flange 758 by fitting 804. The cooled coolant enters stacked semiconductor microcooler 700 by way of inlet 756 that is aligned with inlet passage 702. Passage 702 allows the cooled coolant to enter each level of the stacked semiconductor microcooler 700 and pass through the fin treches thereof, thereby allowing for heat to transfer from the fins of each level of the stacked semiconductor microcooler 700 into the coolant. The heated coolant exits the fin trenches at outlet passage 702 and exits the stacked semiconductor microcooler 700 at outlet 756 that is aligned with outlet passage 702. The heated coolant enters the hose 808 which may be attached to flange 758 by fitting 804. Hose 808 is configured to route the heated coolant to a coolant chiller that cools the heated coolant. From the chiller, the coolant may return to stacked semiconductor microcooler 700 by way of hose 806.

In some embodiments, electronic system 800 may include a frame 802 that is configured to connect with carrier 108 and frame 754. Frame 802 may give the carrier 108 rigidity and may force stacked semiconductor microcooler assembly 750 onto chip 102 such that the exposed surface of stacked semiconductor microcooler 700 maintains a sufficient force against chip 102 to allow for sufficient heat to transfer from chip 102 to stacked semiconductor microcooler 700.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 206, regardless of the actual spatial orientation of the carrier 206. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. A method comprising:
forming a first semiconductor microcooler by removing portions of a first bulk silicon substrate to form a plurality of first silicon fins and a plurality of first fin trenches, wherein each first fin trench separates adjacent first silicon fins, forming a first copper layer upon sidewalls of each of the plurality of first silicon fins, forming a first fin trench filler within each of the plurality of first fin trenches, and by forming a first bonding layer upon a respective upper surface of each of the first plurality of silicon fins;
forming a second semiconductor microcooler by removing portions of a second bulk silicon substrate to form a plurality of second silicon fins and a plurality of second fin trenches, wherein each second fin trench separates adjacent second silicon fins, forming a second copper layer upon sidewalls of each of the plurality of second silicon fins, forming a second fin trench filler within each of the plurality of second fin trenches, and by forming a second bonding layer upon a respective upper surface of each of the second plurality of silicon fins; and
stacking the first microcooler and the second microcooler by vertically aligning the plurality of first fin trenches with the plurality of second fin trenches and connecting the first bonding layer and the second bonding layer.

2. The method of claim 1, further comprising:
polishing a backside of the second semiconductor microcooler to expose each of the plurality of second fin trench fillers and to expose each of the plurality of second silicon fins.

3. The method of claim 2, further comprising:
forming a third semiconductor microcooler by removing portions of a third bulk silicon substrate to form a plurality of third silicon fins and a plurality of third fin trenches, wherein each third fin trench separates adjacent third silicon fins, forming a third copper layer upon sidewalls of each of the plurality of third silicon fins, by forming a third bonding layer upon a respective upper surface of each of the third plurality of silicon fins, and forming a third fin trench filler within each of the plurality of first fin trenches.

4. The method of claim 3, further comprising:
stacking the third microcooler and the second microcooler by vertically aligning the plurality of third fin trenches with the exposed plurality of second fin trenches and thermally connecting the third bonding layer and the exposed plurality of second silicon fins.

5. The method of claim 4, further comprising:
removing the first fin trench filler, the second fin trench filler, and the third trench filler.

6. The method of claim 5, wherein the first fin trench filler, the second fin trench filler, and the third trench filler are comprised of a metal that has a melting point above ambient and below that of copper.

* * * * *